(12) United States Patent
Watson et al.

(10) Patent No.: US 9,264,069 B2
(45) Date of Patent: Feb. 16, 2016

(54) CODE GENERATOR AND DECODER FOR COMMUNICATIONS SYSTEMS OPERATING USING HYBRID CODES TO ALLOW FOR MULTIPLE EFFICIENT USES OF THE COMMUNICATIONS SYSTEMS

(75) Inventors: Mark Watson, San Francisco, CA (US); Michael G. Luby, Berkeley, CA (US)

(73) Assignee: Digital Fountain, Inc., San Diego, CA (US)

( * ) Notice: Subject to any disclaimer, the term of this patent is extended or adjusted under 35 U.S.C. 154(b) by 0 days.

(21) Appl. No.: 13/170,028

(22) Filed: Jun. 27, 2011

(65) Prior Publication Data

US 2011/0258510 A1    Oct. 20, 2011

Related U.S. Application Data

(63) Continuation of application No. 11/747,191, filed on May 10, 2007, now Pat. No. 7,971,129.

(60) Provisional application No. 60/799,536, filed on May 10, 2006.

(51) Int. Cl.
*H03M 13/00* (2006.01)
*H03M 13/03* (2006.01)
*H04L 1/00* (2006.01)

(52) U.S. Cl.
CPC ............. *H03M 13/03* (2013.01); *H04L 1/0052* (2013.01); *H04L 1/0064* (2013.01)

(58) Field of Classification Search
CPC ..... H04L 1/0052; H04L 1/0064; H03M 13/03
USPC .......................................... 714/752, 758, 784
See application file for complete search history.

(56) References Cited

U.S. PATENT DOCUMENTS 3,909,721 A   9/1975  Bussgang et al.
4,365,338 A   12/1982 McRae et al.
(Continued)

FOREIGN PATENT DOCUMENTS

CN   1338839 A   3/2002
CN   1425228 A   6/2003
(Continued)

OTHER PUBLICATIONS

Goyal: "Multiple Description Coding: Compression Meets the Network," In Signal Processing Magazine, IEEE, vol. 18., Issue 5 (Sep. 2001) pp. 74-93 URL:http://www.rle.mit.edu/stir/documents/Goyal_SigProcMag2001_MD.pdf [Nov. 4, 2007].
(Continued)

*Primary Examiner* — Sam Rizk

(57) ABSTRACT

A method of encoding data for transmissions from a source to a destination over a communications channel is provided. The method operates on an ordered set of source symbols and may generate zero or more redundant symbols from the source symbols, wherein data is encoded in a first step according to a simple FEC code and in a second step, data is encoded according to a second FEC code, more complex than the first FEC code. The first FEC code and/or the second FEC code might comprise coding known in the art. These steps result in two groups of encoded data in such a way that a low-complexity receiver may make use of one of the groups of encoded data while higher complexity receivers may make use of both groups of encoded data.

16 Claims, 5 Drawing Sheets

(56) References Cited

U.S. PATENT DOCUMENTS

| | | |
|---|---|---|
| 4,589,112 A | 5/1986 | Karim |
| 4,901,319 A | 2/1990 | Ross |
| 5,136,592 A | 8/1992 | Weng |
| 5,153,591 A | 10/1992 | Clark |
| 5,329,369 A | 7/1994 | Willis et al. |
| 5,331,320 A | 7/1994 | Cideciyan et al. |
| 5,371,532 A | 12/1994 | Gelman et al. |
| 5,372,532 A | 12/1994 | Robertson, Jr. |
| 5,379,297 A | 1/1995 | Glover et al. |
| 5,421,031 A | 5/1995 | De Bey |
| 5,425,050 A | 6/1995 | Schreiber et al. |
| 5,432,787 A | 7/1995 | Chethik |
| 5,455,823 A | 10/1995 | Noreen et al. |
| 5,465,318 A | 11/1995 | Sejnoha |
| 5,517,508 A | 5/1996 | Scott |
| 5,524,025 A | 6/1996 | Lawrence et al. |
| 5,566,208 A | 10/1996 | Balakrishnan |
| 5,568,614 A | 10/1996 | Mendelson et al. |
| 5,583,784 A | 12/1996 | Kapust et al. |
| 5,608,738 A | 3/1997 | Matsushita |
| 5,617,541 A | 4/1997 | Albanese et al. |
| 5,642,365 A | 6/1997 | Murakami et al. |
| 5,659,614 A | 8/1997 | Bailey, III |
| 5,699,473 A | 12/1997 | Kim |
| 5,701,582 A | 12/1997 | DeBey |
| 5,751,336 A | 5/1998 | Aggarwal et al. |
| 5,754,563 A | 5/1998 | White |
| 5,757,415 A | 5/1998 | Asamizuya et al. |
| 5,802,394 A | 9/1998 | Baird et al. |
| 5,805,825 A | 9/1998 | Danneels et al. |
| 5,835,165 A | 11/1998 | Keate et al. |
| 5,844,636 A | 12/1998 | Joseph et al. |
| 5,852,565 A | 12/1998 | Demos |
| 5,870,412 A | 2/1999 | Schuster et al. |
| 5,903,775 A | 5/1999 | Murray |
| 5,917,852 A | 6/1999 | Butterfield et al. |
| 5,926,205 A | 7/1999 | Krause et al. |
| 5,933,056 A | 8/1999 | Rothenberg |
| 5,936,659 A | 8/1999 | Viswanathan et al. |
| 5,936,949 A | 8/1999 | Pasternak et al. |
| 5,953,537 A | 9/1999 | Balicki et al. |
| 5,970,098 A | 10/1999 | Herzberg |
| 5,983,383 A | 11/1999 | Wolf |
| 5,993,056 A | 11/1999 | Vaman et al. |
| 6,005,477 A | 12/1999 | Deck et al. |
| 6,011,590 A | 1/2000 | Saukkonen |
| 6,012,159 A | 1/2000 | Fischer et al. |
| 6,014,706 A | 1/2000 | Cannon et al. |
| 6,018,359 A | 1/2000 | Kermode et al. |
| 6,041,001 A | 3/2000 | Estakhri |
| 6,044,485 A | 3/2000 | Dent et al. |
| 6,061,820 A | 5/2000 | Nakakita et al. |
| 6,073,250 A | 6/2000 | Luby et al. |
| 6,079,041 A | 6/2000 | Kunisa et al. |
| 6,079,042 A | 6/2000 | Vaman et al. |
| 6,081,907 A | 6/2000 | Witty et al. |
| 6,081,909 A | 6/2000 | Luby et al. |
| 6,081,918 A | 6/2000 | Spielman |
| 6,088,330 A | 7/2000 | Bruck et al. |
| 6,097,320 A | 8/2000 | Kuki et al. |
| 6,134,596 A | 10/2000 | Bolosky et al. |
| 6,141,053 A | 10/2000 | Saukkonen |
| 6,141,787 A | 10/2000 | Kunisa et al. |
| 6,141,788 A | 10/2000 | Rosenberg et al. |
| 6,154,452 A | 11/2000 | Marko et al. |
| 6,163,870 A | 12/2000 | Luby et al. |
| 6,166,544 A | 12/2000 | Debbins et al. |
| 6,175,944 B1 | 1/2001 | Urbanke et al. |
| 6,178,536 B1 | 1/2001 | Sorkin |
| 6,185,265 B1 | 2/2001 | Campanella |
| 6,195,777 B1 | 2/2001 | Luby et al. |
| 6,223,324 B1 | 4/2001 | Sinha et al. |
| 6,226,259 B1 | 5/2001 | Piret |
| 6,226,301 B1 | 5/2001 | Cheng et al. |
| 6,229,824 B1 | 5/2001 | Marko |
| 6,243,846 B1 | 6/2001 | Schuster et al. |
| 6,272,658 B1 | 8/2001 | Steele et al. |
| 6,278,716 B1 | 8/2001 | Rubenstein et al. |
| 6,298,462 B1 | 10/2001 | Yi |
| 6,307,487 B1 | 10/2001 | Luby |
| 6,314,289 B1 | 11/2001 | Eberlein et al. |
| 6,320,520 B1 | 11/2001 | Luby |
| 6,332,163 B1 | 12/2001 | Bowman-Amuah |
| 6,333,926 B1 | 12/2001 | Van Heeswyk et al. |
| 6,373,406 B2 | 4/2002 | Luby |
| 6,393,065 B1 | 5/2002 | Piret et al. |
| 6,411,223 B1 | 6/2002 | Haken et al. |
| 6,415,326 B1 | 7/2002 | Gupta et al. |
| 6,420,982 B1 | 7/2002 | Brown |
| 6,421,387 B1 | 7/2002 | Rhee |
| 6,430,233 B1 | 8/2002 | Dillon et al. |
| 6,445,717 B1 | 9/2002 | Gibson et al. |
| 6,459,811 B1 | 10/2002 | Hurst, Jr. |
| 6,466,698 B1 | 10/2002 | Creusere |
| 6,473,010 B1 | 10/2002 | Vityaev et al. |
| 6,486,803 B1 | 11/2002 | Luby et al. |
| 6,487,692 B1 | 11/2002 | Morelos-Zaragoza |
| 6,496,980 B1 | 12/2002 | Tillman et al. |
| 6,497,479 B1 | 12/2002 | Stoffel et al. |
| 6,510,177 B1 | 1/2003 | De Bonet et al. |
| 6,523,147 B1 | 2/2003 | Kroeger et al. |
| 6,535,920 B1 | 3/2003 | Parry et al. |
| 6,577,599 B1 | 6/2003 | Gupta et al. |
| 6,584,543 B2 * | 6/2003 | Williams et al. ............... 711/105 |
| 6,609,223 B1 | 8/2003 | Wolfgang |
| 6,614,366 B2 | 9/2003 | Luby |
| 6,618,451 B1 | 9/2003 | Gonikberg |
| 6,631,172 B1 | 10/2003 | Shokrollahi et al. |
| 6,633,856 B2 | 10/2003 | Richardson et al. |
| 6,641,366 B2 | 11/2003 | Nordhoff |
| 6,643,332 B1 | 11/2003 | Morelos-Zaragoza et al. |
| 6,677,864 B2 | 1/2004 | Khayrallah |
| 6,678,855 B1 | 1/2004 | Gemmell |
| 6,694,476 B1 | 2/2004 | Sridharan et al. |
| 6,704,370 B1 | 3/2004 | Chheda et al. |
| 6,732,325 B1 | 5/2004 | Tash et al. |
| 6,742,154 B1 | 5/2004 | Barnard |
| 6,748,441 B1 | 6/2004 | Gemmell |
| 6,751,772 B1 | 6/2004 | Kim et al. |
| 6,765,866 B1 | 7/2004 | Wyatt |
| 6,804,202 B1 | 10/2004 | Hwang |
| 6,810,499 B2 | 10/2004 | Sridharan et al. |
| 6,820,221 B2 | 11/2004 | Fleming |
| 6,831,172 B1 | 12/2004 | Barbucci et al. |
| 6,849,803 B1 | 2/2005 | Gretz |
| 6,850,736 B2 | 2/2005 | McCune, Jr. |
| 6,856,263 B2 | 2/2005 | Shokrollahi et al. |
| 6,868,083 B2 | 3/2005 | Apostolopoulos et al. |
| 6,876,623 B1 | 4/2005 | Lou et al. |
| 6,882,618 B1 | 4/2005 | Sakoda et al. |
| 6,895,547 B2 | 5/2005 | Eleftheriou et al. |
| 6,909,383 B2 | 6/2005 | Shokrollahi et al. |
| 6,928,603 B1 | 8/2005 | Castagna et al. |
| 6,937,618 B1 | 8/2005 | Noda et al. |
| 6,956,875 B2 | 10/2005 | Kapadia et al. |
| 6,965,636 B1 | 11/2005 | DesJardins et al. |
| 6,985,459 B2 | 1/2006 | Dickson |
| 6,995,692 B2 | 2/2006 | Yokota et al. |
| 7,010,052 B2 | 3/2006 | Dill et al. |
| 7,030,785 B2 | 4/2006 | Shokrollahi et al. |
| 7,031,257 B1 | 4/2006 | Lu et al. |
| 7,057,534 B2 | 6/2006 | Luby |
| 7,068,681 B2 | 6/2006 | Chang et al. |
| 7,068,729 B2 | 6/2006 | Shokrollahi et al. |
| 7,072,971 B2 | 7/2006 | Lassen et al. |
| 7,073,191 B2 | 7/2006 | Srikantan et al. |
| 7,100,188 B2 | 8/2006 | Hejna et al. |
| 7,110,412 B2 | 9/2006 | Costa et al. |
| 7,139,660 B2 | 11/2006 | Sarkar et al. |
| 7,139,960 B2 | 11/2006 | Shokrollahi |
| 7,143,433 B1 | 11/2006 | Duan et al. |
| 7,151,754 B1 | 12/2006 | Boyce et al. |
| 7,154,951 B2 | 12/2006 | Wang |
| 7,164,370 B1 | 1/2007 | Mishra |

(56) References Cited

U.S. PATENT DOCUMENTS

| | | |
|---|---|---|
| 7,164,882 B2 | 1/2007 | Poltorak |
| 7,168,030 B2 | 1/2007 | Ariyoshi |
| 7,219,289 B2 | 5/2007 | Dickson |
| 7,231,404 B2 | 6/2007 | Paila et al. |
| 7,233,264 B2 | 6/2007 | Luby |
| 7,240,236 B2 | 7/2007 | Cutts et al. |
| 7,240,358 B2 | 7/2007 | Horn et al. |
| 7,243,285 B2 | 7/2007 | Foisy et al. |
| 7,249,291 B2 | 7/2007 | Rasmussen et al. |
| 7,254,754 B2 | 8/2007 | Hetzler et al. |
| 7,257,764 B2 | 8/2007 | Suzuki et al. |
| 7,265,688 B2 | 9/2007 | Shokrollahi et al. |
| 7,293,222 B2 | 11/2007 | Shokrollahi et al. |
| 7,295,573 B2 | 11/2007 | Yi et al. |
| 7,304,990 B2 | 12/2007 | Rajwan |
| 7,318,180 B2 | 1/2008 | Starr |
| 7,320,099 B2 | 1/2008 | Miura et al. |
| 7,363,048 B2 | 4/2008 | Cheng et al. |
| 7,391,717 B2 | 6/2008 | Klemets et al. |
| 7,394,407 B2 | 7/2008 | Shokrollahi et al. |
| 7,398,454 B2 | 7/2008 | Cai et al. |
| 7,409,626 B1 | 8/2008 | Schelstraete |
| 7,412,641 B2 | 8/2008 | Shokrollahi |
| 7,451,377 B2 | 11/2008 | Shokrollahi |
| 7,483,447 B2 | 1/2009 | Chang et al. |
| 7,483,489 B2 | 1/2009 | Gentric et al. |
| 7,512,697 B2 | 3/2009 | Lassen et al. |
| 7,525,994 B2 | 4/2009 | Scholte |
| 7,529,806 B1 | 5/2009 | Shteyn |
| 7,532,132 B2 | 5/2009 | Shokrollahi et al. |
| 7,555,006 B2 | 6/2009 | Wolfe et al. |
| 7,559,004 B1 | 7/2009 | Chang et al. |
| 7,570,665 B2 | 8/2009 | Ertel et al. |
| 7,574,706 B2 | 8/2009 | Meulemans et al. |
| 7,590,118 B2 | 9/2009 | Giesberts et al. |
| 7,597,423 B2 | 10/2009 | Silverbrook |
| 7,613,183 B1 | 11/2009 | Brewer et al. |
| 7,633,413 B2 | 12/2009 | Shokrollahi et al. |
| 7,633,970 B2 | 12/2009 | Van Kampen et al. |
| 7,644,335 B2 | 1/2010 | Luby et al. |
| 7,650,036 B2 | 1/2010 | Lei et al. |
| 7,668,198 B2 | 2/2010 | Yi et al. |
| 7,711,068 B2 | 5/2010 | Shokrollahi et al. |
| 7,720,096 B2 | 5/2010 | Klemets |
| 7,720,174 B2 | 5/2010 | Shokrollahi et al. |
| 7,812,743 B2 | 10/2010 | Luby |
| 7,831,896 B2 | 11/2010 | Amram et al. |
| 7,924,913 B2 | 4/2011 | Sullivan et al. |
| 7,961,700 B2 | 6/2011 | Malladi et al. |
| 7,979,769 B2 | 7/2011 | Chun et al. |
| 8,027,328 B2 | 9/2011 | Yang et al. |
| 8,028,322 B2 | 9/2011 | Riedl et al. |
| 8,081,716 B2 | 12/2011 | Kang et al. |
| 8,135,073 B2 | 3/2012 | Shen |
| 8,185,794 B2 | 5/2012 | Lohmar et al. |
| 8,185,809 B2 | 5/2012 | Luby et al. |
| RE43,741 E | 10/2012 | Shokrollahi et al. |
| 8,301,725 B2 | 10/2012 | Biderman et al. |
| 8,327,403 B1 | 12/2012 | Chilvers et al. |
| 8,340,133 B2 | 12/2012 | Kim et al. |
| 8,422,474 B2 | 4/2013 | Park et al. |
| 8,462,643 B2 | 6/2013 | Walton et al. |
| 8,544,043 B2 | 9/2013 | Parekh et al. |
| 8,572,646 B2 | 10/2013 | Haberman et al. |
| 8,615,023 B2 | 12/2013 | Oh et al. |
| 8,638,796 B2 | 1/2014 | Dan et al. |
| 8,713,624 B1 | 4/2014 | Harvey et al. |
| 8,737,421 B2 | 5/2014 | Zhang et al. |
| 8,812,735 B2 | 8/2014 | Igarashi |
| 2001/0015944 A1 | 8/2001 | Takahashi et al. |
| 2001/0033586 A1 | 10/2001 | Takashimizu et al. |
| 2002/0009137 A1 | 1/2002 | Nelson et al. |
| 2002/0053062 A1 | 5/2002 | Szymanski |
| 2002/0083345 A1 | 6/2002 | Halliday et al. |
| 2002/0085013 A1 | 7/2002 | Lippincott |
| 2002/0133247 A1 | 9/2002 | Smith et al. |
| 2002/0141433 A1 | 10/2002 | Kwon et al. |
| 2002/0143953 A1 | 10/2002 | Aiken |
| 2002/0191116 A1 | 12/2002 | Kessler et al. |
| 2003/0005386 A1 | 1/2003 | Bhatt et al. |
| 2003/0037299 A1 | 2/2003 | Smith |
| 2003/0058958 A1 | 3/2003 | Shokrollahi et al. |
| 2003/0086515 A1 | 5/2003 | Trans et al. |
| 2003/0101408 A1 | 5/2003 | Martinian et al. |
| 2003/0106014 A1 | 6/2003 | Dohmen et al. |
| 2003/0138043 A1 | 7/2003 | Hannuksela |
| 2003/0194211 A1 | 10/2003 | Abecassis |
| 2003/0207696 A1 | 11/2003 | Willenegger et al. |
| 2003/0224773 A1 | 12/2003 | Deeds |
| 2004/0015768 A1 | 1/2004 | Bordes et al. |
| 2004/0031054 A1 | 2/2004 | Dankworth et al. |
| 2004/0049793 A1 | 3/2004 | Chou |
| 2004/0066854 A1 | 4/2004 | Hannuksela |
| 2004/0081106 A1 | 4/2004 | Bruhn |
| 2004/0096110 A1 | 5/2004 | Yogeshwar et al. |
| 2004/0117716 A1 | 6/2004 | Shen |
| 2004/0151109 A1 | 8/2004 | Batra et al. |
| 2004/0162071 A1 | 8/2004 | Grilli et al. |
| 2004/0207548 A1 | 10/2004 | Kilbank |
| 2004/0231004 A1 | 11/2004 | Seo |
| 2004/0240382 A1 | 12/2004 | Ido et al. |
| 2004/0255328 A1 | 12/2004 | Baldwin et al. |
| 2005/0018635 A1 | 1/2005 | Proctor |
| 2005/0028067 A1* | 2/2005 | Weirauch ............... 714/758 |
| 2005/0041736 A1 | 2/2005 | Butler-Smith et al. |
| 2005/0071491 A1 | 3/2005 | Seo |
| 2005/0091697 A1 | 4/2005 | Tanaka et al. |
| 2005/0097213 A1 | 5/2005 | Barrett et al. |
| 2005/0102371 A1 | 5/2005 | Aksu |
| 2005/0105371 A1 | 5/2005 | Johnson et al. |
| 2005/0123058 A1 | 6/2005 | Greenbaum et al. |
| 2005/0138286 A1 | 6/2005 | Franklin et al. |
| 2005/0160272 A1 | 7/2005 | Teppler |
| 2005/0163468 A1 | 7/2005 | Takahashi et al. |
| 2005/0169379 A1 | 8/2005 | Shin et al. |
| 2005/0180415 A1 | 8/2005 | Cheung et al. |
| 2005/0193309 A1 | 9/2005 | Grilli et al. |
| 2005/0195752 A1 | 9/2005 | Amin et al. |
| 2005/0195899 A1 | 9/2005 | Han |
| 2005/0195900 A1 | 9/2005 | Han |
| 2005/0207392 A1 | 9/2005 | Sivalingham et al. |
| 2005/0216472 A1 | 9/2005 | Leon et al. |
| 2005/0216951 A1 | 9/2005 | MacInnis |
| 2005/0254575 A1 | 11/2005 | Hannuksela et al. |
| 2005/0257106 A1 | 11/2005 | Luby et al. |
| 2006/0015568 A1 | 1/2006 | Walsh et al. |
| 2006/0020796 A1 | 1/2006 | Aura et al. |
| 2006/0031738 A1 | 2/2006 | Fay et al. |
| 2006/0036930 A1 | 2/2006 | Luby et al. |
| 2006/0037057 A1 | 2/2006 | Xu |
| 2006/0093634 A1 | 5/2006 | Lutz et al. |
| 2006/0107174 A1 | 5/2006 | Heise |
| 2006/0109805 A1 | 5/2006 | Malamal Vadakital et al. |
| 2006/0120464 A1 | 6/2006 | Hannuksela |
| 2006/0193524 A1 | 8/2006 | Tarumoto et al. |
| 2006/0212444 A1 | 9/2006 | Handman et al. |
| 2006/0212782 A1 | 9/2006 | Li |
| 2006/0229075 A1 | 10/2006 | Kim et al. |
| 2006/0244824 A1 | 11/2006 | Debey |
| 2006/0244865 A1 | 11/2006 | Simon |
| 2006/0248195 A1 | 11/2006 | Toumura et al. |
| 2006/0256851 A1 | 11/2006 | Wang et al. |
| 2006/0262856 A1 | 11/2006 | Wu et al. |
| 2006/0279437 A1 | 12/2006 | Luby et al. |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0081586 A1 | 4/2007 | Raveendran et al. |
| 2007/0110074 A1 | 5/2007 | Bradley et al. |
| 2007/0127576 A1 | 6/2007 | Henocq et al. |

(56) References Cited

U.S. PATENT DOCUMENTS

| | | |
|---|---|---|
| 2007/0134005 A1 | 6/2007 | Myong et al. |
| 2007/0140369 A1 | 6/2007 | Limberg |
| 2007/0157267 A1 | 7/2007 | Lopez-Estrada |
| 2007/0162568 A1 | 7/2007 | Gupta et al. |
| 2007/0162611 A1 | 7/2007 | Yu et al. |
| 2007/0176800 A1 | 8/2007 | Rijavec |
| 2007/0177811 A1 | 8/2007 | Yang |
| 2007/0185973 A1 | 8/2007 | Wayda et al. |
| 2007/0195894 A1 | 8/2007 | Shokrollahi et al. |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | ORourke et al. |
| 2007/0255844 A1 | 11/2007 | Shen et al. |
| 2007/0277209 A1 | 11/2007 | Yousef |
| 2007/0300127 A1 | 12/2007 | Watson et al. |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0152241 A1 | 6/2008 | Itoi et al. |
| 2008/0168133 A1 | 7/2008 | Osborne |
| 2008/0168516 A1 | 7/2008 | Flick et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0303896 A1 | 12/2008 | Lipton et al. |
| 2008/0309525 A1 | 12/2008 | Shokrollahi et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0031199 A1 | 1/2009 | Luby et al. |
| 2009/0043906 A1 | 2/2009 | Hurst et al. |
| 2009/0055705 A1 | 2/2009 | Gao |
| 2009/0067551 A1 | 3/2009 | Chen et al. |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0195640 A1 | 8/2009 | Kim et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1 | 1/2010 | Stockhammer et al. |
| 2010/0020871 A1 | 1/2010 | Hannuksela et al. |
| 2010/0023525 A1 | 1/2010 | Westerlund et al. |
| 2010/0046906 A1 | 2/2010 | Kanamori et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0103001 A1 | 4/2010 | Shokrollahi et al. |
| 2010/0131671 A1 | 5/2010 | Kohli et al. |
| 2010/0153578 A1 | 6/2010 | Van Gassel et al. |
| 2010/0165077 A1 | 7/2010 | Yin et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0223533 A1 | 9/2010 | Stockhammer et al. |
| 2010/0235472 A1 | 9/2010 | Sood et al. |
| 2010/0235528 A1 | 9/2010 | Bocharov et al. |
| 2010/0257051 A1 | 10/2010 | Fernandez Gutierrez |
| 2010/0318632 A1 | 12/2010 | Yoo et al. |
| 2011/0019769 A1 | 1/2011 | Shokrollahi et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0103519 A1 | 5/2011 | Shokrollahi et al. |
| 2011/0119394 A1 | 5/2011 | Wang et al. |
| 2011/0119396 A1 | 5/2011 | Kwon et al. |
| 2011/0216541 A1 | 9/2011 | Inoue et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0299629 A1 | 12/2011 | Luby et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0042090 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |
| 2013/0254634 A1 | 9/2013 | Luby |
| 2013/0287023 A1 | 10/2013 | Bims |
| 2014/0009578 A1 | 1/2014 | Chen et al. |
| 2014/0380113 A1 | 12/2014 | Luby |

FOREIGN PATENT DOCUMENTS

| | | |
|---|---|---|
| CN | 1481643 A | 3/2004 |
| CN | 1708934 A | 12/2005 |
| CN | 1714577 A | 12/2005 |
| CN | 1792056 A | 6/2006 |
| CN | 1806392 A | 7/2006 |
| CN | 1819661 A | 8/2006 |

(56) References Cited

FOREIGN PATENT DOCUMENTS

| | | |
|---|---|---|
| CN | 1868157 A | 11/2006 |
| CN | 101390399 A | 3/2009 |
| CN | 101729857 A | 6/2010 |
| EP | 0669587 A2 | 8/1995 |
| EP | 0701371 A1 | 3/1996 |
| EP | 0784401 A2 | 7/1997 |
| EP | 0853433 A1 | 7/1998 |
| EP | 0854650 A2 | 7/1998 |
| EP | 0903955 A1 | 3/1999 |
| EP | 0986908 A1 | 3/2000 |
| EP | 1024672 A1 | 8/2000 |
| EP | 1051027 A1 | 11/2000 |
| EP | 1124344 A1 | 8/2001 |
| EP | 1298931 A2 | 4/2003 |
| EP | 1406452 A2 | 4/2004 |
| EP | 1455504 A2 | 9/2004 |
| EP | 1468497 A1 | 10/2004 |
| EP | 1501318 A1 | 1/2005 |
| EP | 1670256 A2 | 6/2006 |
| EP | 1755248 A1 | 2/2007 |
| EP | 2046044 A1 | 4/2009 |
| EP | 2071827 A2 | 6/2009 |
| EP | 1241795 A2 | 8/2009 |
| EP | 2096870 A2 | 9/2009 |
| EP | 1700410 B1 | 4/2010 |
| EP | 2323390 A2 | 5/2011 |
| JP | H07183873 | 7/1995 |
| JP | 08186570 | 7/1996 |
| JP | 8289255 A | 11/1996 |
| JP | 9252253 A | 9/1997 |
| JP | 11041211 A | 2/1999 |
| JP | 11112479 | 4/1999 |
| JP | 11164270 A | 6/1999 |
| JP | 2000151426 A | 5/2000 |
| JP | 2000216835 A | 8/2000 |
| JP | 2000513164 A | 10/2000 |
| JP | 2000307435 A | 11/2000 |
| JP | 2000353969 A | 12/2000 |
| JP | 2001036417 | 2/2001 |
| JP | 2001094625 | 4/2001 |
| JP | 2001223655 A | 8/2001 |
| JP | 2001251287 A | 9/2001 |
| JP | 2001274776 A | 10/2001 |
| JP | 2001274855 A | 10/2001 |
| JP | 2002073625 A | 3/2002 |
| JP | 2002204219 A | 7/2002 |
| JP | 2002543705 A | 12/2002 |
| JP | 2003018568 A | 1/2003 |
| JP | 2003507985 | 2/2003 |
| JP | 2003092564 A | 3/2003 |
| JP | 2003510734 A | 3/2003 |
| JP | 2003174489 | 6/2003 |
| JP | 2003256321 A | 9/2003 |
| JP | 2003318975 A | 11/2003 |
| JP | 2003319012 | 11/2003 |
| JP | 2003333577 A | 11/2003 |
| JP | 2004048704 A | 2/2004 |
| JP | 2004070712 A | 3/2004 |
| JP | 2004135013 A | 4/2004 |
| JP | 2004165922 A | 6/2004 |
| JP | 2004516717 A | 6/2004 |
| JP | 2004192140 A | 7/2004 |
| JP | 2004193992 A | 7/2004 |
| JP | 2004529533 A | 9/2004 |
| JP | 2004289621 A | 10/2004 |
| JP | 2004343701 A | 12/2004 |
| JP | 2004348824 A | 12/2004 |
| JP | 2004362099 A | 12/2004 |
| JP | 2005094140 A | 4/2005 |
| JP | 2005136546 A | 5/2005 |
| JP | 2005514828 T | 5/2005 |
| JP | 2005204170 A | 7/2005 |
| JP | 2005223433 A | 8/2005 |
| JP | 2005277950 A | 10/2005 |
| JP | 2006503463 A | 1/2006 |
| JP | 2006505177 A | 2/2006 |
| JP | 2006506926 A | 2/2006 |
| JP | 2006074335 A | 3/2006 |
| JP | 2006074421 A | 3/2006 |
| JP | 2006115104 A | 4/2006 |
| JP | 3809957 | 6/2006 |
| JP | 2006174032 A | 6/2006 |
| JP | 2006174045 A | 6/2006 |
| JP | 2006186419 A | 7/2006 |
| JP | 2006519517 A | 8/2006 |
| JP | 2006287422 A | 10/2006 |
| JP | 2006319743 A | 11/2006 |
| JP | 2007013675 A | 1/2007 |
| JP | 2007089137 A | 4/2007 |
| JP | 3976163 | 6/2007 |
| JP | 2007158592 A | 6/2007 |
| JP | 2007174170 A | 7/2007 |
| JP | 2007520961 A | 7/2007 |
| JP | 2007228205 A | 9/2007 |
| JP | 2008011404 A | 1/2008 |
| JP | 2008016907 A | 1/2008 |
| JP | 2008508761 A | 3/2008 |
| JP | 2008508762 A | 3/2008 |
| JP | 2008283232 A | 11/2008 |
| JP | 2008283571 A | 11/2008 |
| JP | 2008543142 A | 11/2008 |
| JP | 2008546361 A | 12/2008 |
| JP | 2009027598 A | 2/2009 |
| JP | 2009522921 A | 6/2009 |
| JP | 2009522922 A | 6/2009 |
| JP | 2009171558 A | 7/2009 |
| JP | 2009527949 A | 7/2009 |
| JP | 2009277182 A | 11/2009 |
| JP | 2009544991 A | 12/2009 |
| JP | 2010539832 A | 12/2010 |
| JP | 2008502212 A | 1/2011 |
| JP | 2001189665 A | 2/2011 |
| JP | 2011087103 A | 4/2011 |
| JP | 5231218 | 3/2013 |
| KR | 1020030071815 | 9/2003 |
| KR | 1020030074386 A | 9/2003 |
| KR | 20040107152 A | 12/2004 |
| KR | 20040107401 A | 12/2004 |
| KR | 20050009376 A | 1/2005 |
| KR | 100809086 B1 | 3/2008 |
| KR | 20080083299 A | 9/2008 |
| KR | 20090098919 A | 9/2009 |
| KR | 20100028156 A | 3/2010 |
| RU | 99117925 A | 7/2001 |
| RU | 2189629 C2 | 9/2002 |
| RU | 2265960 C2 | 12/2005 |
| RU | 2290768 C1 | 12/2006 |
| RU | 2297663 C2 | 4/2007 |
| RU | 2312390 C2 | 12/2007 |
| RU | 2357279 C2 | 5/2009 |
| TW | I246841 B | 1/2006 |
| TW | I354908 | 12/2011 |
| TW | I355168 | 12/2011 |
| WO | WO9634463 A1 | 10/1996 |
| WO | WO-9750183 A1 | 12/1997 |
| WO | WO9804973 A1 | 2/1998 |
| WO | WO9832231 | 7/1998 |
| WO | WO-9832256 A1 | 7/1998 |
| WO | WO0014921 A1 | 3/2000 |
| WO | WO0018017 | 3/2000 |
| WO | WO0052600 A1 | 9/2000 |
| WO | WO0120786 A1 | 3/2001 |
| WO | WO0157667 A1 | 8/2001 |
| WO | WO0158130 A2 | 8/2001 |
| WO | WO0158131 A2 | 8/2001 |
| WO | WO0227988 A2 | 4/2002 |
| WO | WO0247391 | 6/2002 |
| WO | 02063461 A1 | 8/2002 |
| WO | WO-03046742 A1 | 6/2003 |
| WO | WO03056703 | 7/2003 |
| WO | WO03105350 | 12/2003 |
| WO | WO-03105484 A1 | 12/2003 |
| WO | WO2004008735 A2 | 1/2004 |
| WO | WO2004015948 A1 | 2/2004 |

(56) References Cited

FOREIGN PATENT DOCUMENTS

| | | |
|---|---|---|
| WO | WO2004019521 A1 | 3/2004 |
| WO | WO2004030273 A1 | 4/2004 |
| WO | WO2004034589 A2 | 4/2004 |
| WO | WO-2004036824 A1 | 4/2004 |
| WO | WO2004040831 A1 | 5/2004 |
| WO | WO-2004047019 A2 | 6/2004 |
| WO | WO2004047455 A1 | 6/2004 |
| WO | WO-2004088988 A1 | 10/2004 |
| WO | WO-2004109538 A1 | 12/2004 |
| WO | WO2005036753 A2 | 4/2005 |
| WO | WO2005041421 A1 | 5/2005 |
| WO | WO2005078982 A1 | 8/2005 |
| WO | WO-2005107123 | 11/2005 |
| WO | WO2005112250 A2 | 11/2005 |
| WO | WO-2006013459 A1 | 2/2006 |
| WO | WO2006020826 A2 | 2/2006 |
| WO | WO-2006036276 | 4/2006 |
| WO | 2006060036 A1 | 6/2006 |
| WO | WO-2006057938 A2 | 6/2006 |
| WO | WO2006084503 A1 | 8/2006 |
| WO | WO-2006116102 A2 | 11/2006 |
| WO | WO-2006135878 A2 | 12/2006 |
| WO | WO2007042916 | 4/2007 |
| WO | WO-2007078253 A2 | 7/2007 |
| WO | WO2007090834 A2 | 8/2007 |
| WO | WO-2007098397 A2 | 8/2007 |
| WO | WO-2007098480 A1 | 8/2007 |
| WO | WO-2008011549 A2 | 1/2008 |
| WO | WO-2008023328 A3 | 4/2008 |
| WO | WO2008054100 A1 | 5/2008 |
| WO | WO2008085013 A1 | 7/2008 |
| WO | WO-2008086313 A1 | 7/2008 |
| WO | WO-2008131023 A1 | 10/2008 |
| WO | 2008144004 A1 | 11/2008 |
| WO | WO2008148708 A1 | 12/2008 |
| WO | WO2008156390 A1 | 12/2008 |
| WO | WO-2009065526 A1 | 5/2009 |
| WO | WO-2009137705 A2 | 11/2009 |
| WO | 2009143741 A1 | 12/2009 |
| WO | WO2010085361 A2 | 7/2010 |
| WO | WO2010088420 A1 | 8/2010 |
| WO | WO2010120804 A1 | 10/2010 |
| WO | WO-2011038013 | 3/2011 |
| WO | WO-2011038034 A1 | 3/2011 |
| WO | 2011059286 A2 | 5/2011 |
| WO | 2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

IETF RFC 2733: Rosenberg, J. et al. "An RTP Payload Format for Generic Forward Error Correction," Network Working Group, RFC 2733 (Dec. 1999).

International Preliminary Report on Patentability, PCT/US2007/068713—The International Bureau of WIPO—Geneva, Switzerland, Nov. 11, 2008.

International Search Report, PCT/US2007/068713.

Written Opinion, PCT/US2007/068713—International Search Authority—US, Jan. 7, 2008.

3GPP TS 26.234 V9.1.0 ,"3rd Generation Partnership Project; Technical Specification Group Services and System Aspects; Transparent end-to-end Packet-switched Streaming Service (PSS); Protocols and codecs (Release 9)", Dec. 2009, 179 pages.

3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pages.

3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010, 91 pages.

3rd Generation Partnership Project; Technical Specification Group Services and System Aspects; Transparent end-to-end packet switched streaming service (PSS); 3GPP file format (3GP) (Release 9), 3GPP Standard; 3GPP TS 26.244, 3rd Generation Partnership Project (3GPP), Mobile Competence Centre; 650, Route Des Lucioles; F-06921 Sophia-Antipolis Cedex; France, No. V9.2.0, Jun. 9, 2010, pp. 1-55, XP050441544, [retrieved on Jun. 9, 2010].

Afzal, et al., "Video Streaming over MBMS: A System Design Approach", Journal of Multimedia, vol. 1, No. 5, Aug. 2006, pp. 25-35.

Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).

Aggarwal, C. et al.: "On Optimal Batching Policies for Video-on-Demand Storage Servers," Multimedia Systems, vol. 4, No. 4, pp. 253-258 (1996).

Albanese, A., et al., "Priority Encoding Transmission", IEEE Transactions on Information Theory, vol. 42, No. 6, pp. 1-22, (Nov. 1996).

Alex Zambelli,"IIS Smooth Streaming Technical Overview", Microsoft Mar. 25, 2009, XP002620446, Retrieved from the Internet: URL:http://www.microsoft.com/downloads/en/ details. aspx"FamilyID=03d22583-3ed6-44da-8464-blb4b5ca7520, [retrieved on Jan. 21, 2011].

Aljoscha Smolic et al., "Development of a New MPEG Standard for Advanced 3D Video Applications", IEEE International Symposium on Image and Signal Processing and Analysis, Sep. 16, 2009, pp. 400-407, XP031552049, 978-953-184-135-1.

Almeroth, et al., "The use of multicast delivery to provide a scalable and interactive video-on-demand service", IEEE Journal on Selected Areas in Communication, 14(6): 1110-1122, (1996).

Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.

Amin Shokrollahi: "LDPC Codes: An Introduction" Internet Citation 2 Apr. 1, 2003 (Apr. 2, 2003), XP002360065 Retrieved from the Internet: URL : http ://www . ipm. ac . ir/IPM/homepage/Amin 2. pdf [retrieved on Dec. 19, 2005].

Amon P et al., "File Format for Scalable Video Coding", IEEE Transactions on Circuits and Systems for Video Technology, IEEE Service Center, Piscataway, NJ, US, vol. 17, No. 9, Sep. 1, 2007, pp. 1174-1185, XP011193013, ISSN: 1051-8215, DOI:10.1109/TCSVT.2007.905521.

Anonymous: [Gruneberg, K., Narasimhan, S. and Chen, Y., editors] "Text of ISO/IEC 13818-1:2007/PDAM 6 MVC operation point descriptor", 90 Mpeg Meeting; Oct. 26, 2009-Oct. 30, 2009; Xian; (Motion Picture Expertgroup or ISO/IEC JTC1/SC29/WG11), No. N10942, Nov. 19, 2009, XP030017441.

Anonymous: "Text of ISO/IEC 14496-12 3rd Edition", 83 MPEG Meeting; Jan. 14, 2008-Jan. 18, 2008; Antalya; (Motion PictureExpert Group or ISO/IEC JTC1/SC29/WG11), No. N9678, Apr. 22, 2008, XP030016172.

Anonymous: "Text of ISO/IEC 14496-12:2008/PDAM 2 Sub-track selection & switching", 91. Mpeg Meeting; Jan. 18, 2010-Jan. 22, 2010; Kyoto; (Motion Picture Expertgroup or ISO/IEC JTC1/SC29/WG11), No. N11137, Jan. 22, 2010, XP030017634, ISSN: 0000-0030.

Anonymous: "Text of ISO/IEC 14496-15 2nd edition", 91 MPEG Meeting; Jan. 18, 2010-Jan. 22, 2010; Kyoto; (Motion Picture ExpertGroup or ISO/IEC JTC1/SC29/WG11),, No. N11139, Jan. 22, 2010, XP030017636.

Apple Inc., "On the time-stamps in the segment-inbox for httpstreaming (26.244, R9)", TSG-SA4#58 meeting, Vancouver, Canada, Apr. 2010, p. 5.

Bar-Noy, et al., "Competitive on-line stream merging algorithms for media-on-demand", Draft (Jul. 2000), pp. 1-34.

Bar-Noy et al. "Efficient algorithms for optimal stream merging for media-on-demand," Draft (Aug. 2000), pp. 1-43.

Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 889-893, XP000464977.

(56) References Cited

OTHER PUBLICATIONS

Bitner, J.R., et al.: "Efficient Generation of the Binary Reflected Gray code and Its Applications," Communications of the ACM, pp. 517-521, vol. 19 (9), 1976.
Blomer, et al., "An XOR-Based Erasure-Resilient Coding Scheme," ICSI Technical Report No. TR-95-048 (1995) [avail. At ftp://ftp.icsi.berkeley.edu/pub/techreports/1995/tr-95-048.pdf].
Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.
Byers, J.W. et al.: "Accessing multiple mirror sites in parallel: using Tornado codes to speed up downloads," 1999, Eighteenth Annual Joint Conference of the IEEE Comupter and Communications Socities, pp. 275-283, Mar. 21, 1999, XP000868811.
Charles Lee L.H, "Error-Control Block Codes for Communications Engineers", 2000, Artech House, XP002642221 pp. 39-45.
Chen, et al., U.S. Patent Application titled "Frame Packing for Asymmetric Stereo Video", filed Feb. 25, 2011.
Chen, et al., U.S. Patent Application titled "One-Stream Coding for Asymmetric Stereo Video", filed Feb. 25, 2011.
Chen Ying et al., "Coding techniques in Multiview Video Coding and Joint Multiview Video Model", Picture Coding Symposium, 2009, PCS 2009, IEEE, Piscataway, NJ, USA, May 6, 2009, pp. 1-4, XP031491747, ISBN: 978-1-4244-4593-6.
Choi S: "Temporally enhanced erasure codes for reliable communication protocols" Computer Networks, Elsevier Science Publishers B.V., Amsterdam, NL, vol. 38, No. 6, Apr. 22, 2002, pp. 713-730, XP004345778, ISSN: 1389-1286, DOI:10.1016/S1389-1286(01)00280-8.
Clark G.C., et al., "Error Correction Coding for Digital Communications, System Applications," Error Correction Coding for Digital Communications, New York, Plenum Press, US, Jan. 1, 1981, pp. 339-341.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.com/journals/ijdmb/2009/614178.html> [retrieved on May 12, 2010].
Dan, A. et al.: "Scheduling Policies for an On-Demand Video Server with Batching," Proc. ACM Multimedia, pp. 15-23 (Oct. 1998).
Davey, M.C. et al.: "Low Density Parity Check Codes over GF(q)" IEEE Communications Letters, vol. 2, No. 6 pp. 165-167 (1998).
David Singer, et al., "ISO/IEC 14496-15/FDIS, International Organization for Standardization Organization Internationale De Normalization ISO/IEC JTC1/SC29/WG11 Coding of Moving Pictures and Audio", ISO/IEC 2003, Aug. 11, 2003, pp. 1-34.
Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.
Digital Fountain: "Raptor code specification for MBMS file download," 3GPP SA4 PSM AD-HOC #31 (May 21, 2004) XP002355055 pp. 1-6.
"Digital Video Broadcasting (DVB); Guidelines for the implementation of DVB-IP Phase 1 specifications; ETSI TS 102 542" ETSI Standards, Lis, Sophia AntipolisCedex, France, vol. BC, No. V1.2.1, Apr. 1, 2008, XP014041619 ISSN: 0000-0001 p. 43 p. 66 pp. 70, 71.
DVB-IPI Standard: DVB BlueBook A086r4 (Mar. 2007) Transport of MPEG 2 Transport Streatm (TS) Based DVB Services over IP Based Networks, ETSI Technical Specification 102 034 v1.3.1.
Eager, et al. "Minimizing bandwidth requirements for on-demand data delivery," Proceedings of the International Workshop on Advances in Multimedia Information Systems,p. 80-87 (Indian Wells, CA Oct. 1999).
Eager, et al., "Optimal and efficient merging schedules for video-on-demand servers", Proc. ACM Multimedia, vol. 7, pp. 199-202 (1999).
Esaki, et al.: "Reliable IP Multicast Communication Over ATM Networks Using Forward Error Correction Policy," IEICE Transactions on Communications, JP, Institute of Electronics Information and Comm. Eng. Tokyo, vol. E78-V, No. 12, (Dec. 1995), pp. 1622-1637, XP000556183.
Feng, G., Error Correcting Codes over Z2m for Algorithm-Based Fault-Tolerance, IEEE Transactions on Computers, vol. 43, No. 3, Mar. 1994, pp. 370-374.
Fernando, et al., "httpstreaming of MPEG Media—Response to CfP", 93 MPEG Meeting; Jul. 26, 2010-Jul. 30, 2010; Geneva; (Motion Picture Expert Group or ISO/IEC JTC1/SCE29/WG11), No. M17756, Jul. 22, 2010, XP030046346.
Fielding et al., "RFC 2616: Hypertext Transfer Protocol HTTP/1.1", Internet Citation, Jun. 1999, pp. 165, XP002196143, Retrieved from the Internet: URL:http://www.rfc-editor-org/ [retrieved on Apr. 15, 2002].
Frojdh, et al., "File format sub-track selection and switching," ISO/IEC JTC1/SC29/WG11 MPEG2009 M16665, London UK., Jul. 2009, 14 pp.
Gao, L. et al.: "Efficient Schemes for Broadcasting Popular Videos," Proc. Inter. Workshop on Network and Operating System Support for Digital Audio and Video, pp. 1-13 (1998).
Gasiba, Tiago et al., "System Design and Advanced Receiver Techniques for MBMS Broadcast Services" Proc. 2006 International Conference on Communications (ICC 2006), Jun. 1, 2006, pp. 5444-5450, XP031025781 ISBN: 978-1-4244-0354-7.
Gemmell, et al., "A Scalable Multicast Architecture for One-To-Many Telepresentations", Multimedia Computing and Systems, 1998/Proceedings. IEEE International Conference on Austin, TX, USA Jun. 28-Jul. 1, 1998, Los Alamitos, CA USA, IEEE Comput. Soc, US, Jun. 28, 1998, pp. 128-139, XP010291559.
Gozalvez D et, al: "Mobile reception of DVB-T services by means of AL-FEC protection" Proc. IEEE Intern. Symposium on Broadband Multimedia Systems and Broadcasting (BMSB '09), IEEE, Piscataway, NJ, USA, May 13, 2009, pp. 1-5, XP031480155 ISBN: 978-1-4244-2590-7.
Grineberg, et al., "Deliverable D3.2 MVC/SVC storage format" Jan. 29, 2009, XP002599508 Retrieved from the Internet: URL:http://www.ist-sea.eu/Public/SEA_D3.2_HHI FF_20090129.pdf [retrieved on Sep. 1, 2010] paragraph [02.3].
Hagenauer, J. : "Soft is better than hard" Communications, Coding and Cryptology, Kluwer Publication May 1994, XP002606615 Retrieved from the Internet : URL: http://www. Int . ei .turn. de/veroeffentlic hungen/1994/ccc94h. pdf [retrieved on Oct. 25, 2010].
He Wenge et al., "Asymmetric Stereoscopic Video Encoding Algorithm Based on Joint Compensation Prediction", IEEE International Conference on Communications and Mobile Computing, Jan. 6, 2009, pp. 191-194, XP031434775, ISBN: 978-0-7695-3501-2.
Hershey, et al., "Random Parity Coding (RPC)", 1996 IEEE International Conference on Communications (ICC). Converging Technologies for Tomorrow's Applications. Dallas, Jun. 23-27, 1996, IEEE International Conference on Communications (ICC), New York, IEEE, US, vol. 1, Jun. 23, 1996, pp. 122-126, XP000625654.
Hitachi Ltd. et al., "High-Definition Multimedia Interface," Specification Version 1.4, Jun. 5, 2009, 425 pp.
Hua, et al., "Skyscraper broadcasting: A new broadcsting system for metropolitan video-on-demand systems", Proc. ACM SIGCOMM, pp. 89-100 (Cannes, France, 1997).
Ian Trow, "Is 3D Event Coverage Using Existing Broadcast Infrastructure Technically Possible", International Broadcasting Conference, Sep. 9, 2009-Sep. 13, 2009, XP030081671, pp. 4-5, "3D transmission over broadcast infrastructure" pp. 7-8, "Screen signaling"—Conclusions on 3D systems.
Information Technology—Generic Coding of Moving Pictures and Audio: Systems, Amendment 4: Transport of Multiview Video over ITU-T Rec H.222.0 1 ISO/IEC 13818-1 "Text of ISO/IEC 13818-1:2007/FPDAM 4—Transport of Multiview Video over ITU-T Rec H.222.0 | ISO/IEC 13818-1," Lausanne, Switzerland, 2009, 21 pp.
International Standard ISO/IEC 13818-1:2000(E), "Information Technology—Generic Coding of Moving Pictures and Associated Audio Information: Systems," Second edition, Dec. 1, 2000, pp. 1-174.

(56) References Cited

OTHER PUBLICATIONS

International Standard ISO/IEC 14496-12, Information Technology—Coding of audio-visual objects—Part 12: ISO base media file format, Third Edition, Oct. 15, 2008, 120 pp.
International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ISO/IEC JTC 1/SC 29, ISO/IEC FCD 23001-6, Information technology—MPEG systems technologies—Part 6: Dynamic adaptive streaming over HTTP (DASH), Jan. 28, 2011.
ISO/IEC JTC1/SC29/WG11: "Requirements on HTTP Streaming of MPEG Media", 92. MPEG Meeting; Apr. 19, 2010-Apr. 23, 2010; Dresden; No. N11340, May 14, 2010, XP030017837, ISSN: 0000-0029.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol. 3, Mar. 18, 2005, pp. 1097-1100, XP010792442, DOI: 10.1109/ICASSP.2005.1415905 ISBN: 978-0-7803-8874-1.
"Joint Draft 8.0 on Multiview Video Coding", 28th JVT meeting, Hannover, Germany, Document: JVT-AB204 (rev.1), Jul. 2008. available from http:// wftp3. itu.int/av-arch/jvt-site/2008_07_Hannover/JVT-AB204.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kallel, "Complementary Punctured Convolutional (CPC) Codes and Their Applications", IEEE Transactions on Communications, IEEE Inc., New York, US, Vol. 43, No. 6, Jun. 1, 1995, pp. 2005-2009.
Kimata H et al., "Inter-View Prediction With Downsampled Reference Pictures", ITU Study Group 16—Video Coding Experts Group—ISO/IEC MPEG & ITU-T VCEG(ISO/IEC JTC1/SC29/WG11 and ITU-T SG16 Q6), No. JVT-W079, Apr. 19, 2007, XP030007039.
Kozamernik F: "Media streaming over the Internet", Internet Citation, Oct. 2002, XP002266291, Retrieved from the Internet: URL: http://www.ebu.ch/trev_292-kozamerni k. pdf [retrieved on Jan. 8, 2004] section "Video codecs for scalable streaming".
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Lin, S. et al.: "Error Control Coding—Fundamentals and Applications," 1983, Englewood Cliffs, pp. 288, XP002305226.
Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, CH, Oct. 1, 2007, XP015055125, ISSN: 0000-0003.
Luby, et al., "Analysis of Low Density Codes and Improved Designs Using Irregular Graphs", 1998, Proceedings of the 30th Annual ACM Symposium on Theory of Computing, May 23, 1998, pp. 249-258, XP000970907.
Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].
Luby, et al., "FLUTE—File Delivery over Unidirectional Transport", IETF RFC 3926, pp. 1-35, (Oct. 2004).
Luby et al., "Improved Low-Density Parity-Check Codes Using Irregular Graphs and Belief Propogation", Information Theory, 1998. Proceedings. 1998 IEEE International Symposium on Cambridge, MA, USA Aug. 16-21, 1998, pp. 1-9, New York, NY, USA, IEEE, US Aug. 16, 199.
Luby et, al. "Layered Coding Transport (LCT) Building Block", IETF RFC 5651, pp. 1-42, (Oct. 2009).
Luby, M. et al.: "Efficient Erasure Correction Codes," 2001, IEEE Transactions on Information Theory, Vo. 47, No. 2, pp. 569-584, XP002305225.
Luby, M., et, al. "Forward Error Correction (FEC) Building Block", IETF RFC 5052, pp. 1-31, (Aug. 2007).
Luby M et al: "IPTV Systems, Standards and Architectures: Part II—Application Layer FEC In IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Luby, M. et al., "Practical Loss-Resilient Codes: Tornado Codes," 29th Annual ACM Symposium on Theory of Computing, vol. SYMP. 29, May 4, 1997, pp. 150-159, XP002271229.
Luby, M., et al., "Raptor Forward Error Correction Scheme for Object Delivery", IETF RFC5053, pp. 1-46 (Sep. 2007).
Luby, M., et al., "RaptorQ Forward Error Correction Scheme for Object Delivery", IETF draft ietf-rmt-bb-fec-raptorq-04, Reliable Multicast Transport, pp. 1-68, (Aug. 24, 2010).
Luby, M., et al., "Request for Comments: 3453: The Use of Forward Error Correction (FEC) in Reliable Multicast," Internet Article, [Online] Dec. 2002, pp. 1-19.
Luby, Michael G. "Analysis of Random Processes via And-Or Tree Evaluation," Proceedings of the 9th Annual ACM-SIAM Symposium on Discrete Algorithms,TR-97-0, 1998, pp. 364-373, (search date: Jan. 25, 2010) URL: <http://portal.acm.prg.citation.cfm"id=314722>.
Mandelbaum D.M., "An Adaptive-Feedback Coding Scheme Using Incremental Redundancy", IEEE Trans on Information Theory, vol. May 1974, May 1974, pp. 388-389, XP002628271, the whole document.
Marpe, et al., "The H.264/MPEG4 Advanced Video Coding Standard and its Applications," Standards Report, IEEE Communications Magazine, Aug. 2006, pp. 134-143.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
McCanne, et al., "Low-Complexity Video Coding for Receiver-Driven Layered Multicast", IEEE Journal on Selected Areas in Communication IEEE Service Center, Aug. 1, 1997, vol. 15, No. 6, pp. 983-1001, Piscataway, US, XP011054678, ISSN: 0733-8716.
Mimnaugh, A et, al. "Enabling Mobile Coverage for DVB-T" Digital Fountain Whitepaper Jan. 29, 2008, pp. 1-9, XP002581808 Retrieved from the Internet: URL:http://www.digitalfountain.com/ufiles/library/DVB-T-whitepaper.pdf> [retrieved on May 10, 2010].
Min-Goo Kim: "On systematic punctured convolutional codes", IEEE Trans on Communications, vol. 45, No. 2, Feb. 1997, XP002628272, the whole document, pp. 133-139.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Naguib, Ayman, et al., "Applications of Space-Time Block Codes and Interference Suppression for High Capacity and High Data Rate Wireless Systems," IEEE, 1998, pp. 1803-1810.
Narayanan, et al., "Physical Layer Design for Packet Data Over IS-136", Vehicular Technology Conference, 1997, IEEE 47thPhoenix, AZ, USA May 4-7, 1997, New York, NY, USA, IEEE, US May 4, 1997, pp. 1029-1033.
Nokia: "Reed-Solomon Code Specification for. MBMS Download and Streaming Services", 3GPP Draft; S4-050265_RS_SPEC, 3rd Generation Partnership Project (3GPP), Mobile Competence Centre; 650, Route Des Lucioles; F-06921 Sophia-Antipolis Cedex; France, vol. SA WG4, no. San Diego, USA; 20050415, Apr. 15, 2005, XP050287675, [retrieved on Apr. 15, 2005].

(56) References Cited

OTHER PUBLICATIONS

Nokia Corp., "Usage of 'mfra' box for Random Access and Seeking," S4-AHI127, 3GPP TSG-SA4 Ad-Hoc Meeting, Dec. 14-16, 2009, Paris, FR, 2 pp.
Nonnenmacher, et al., "Parity-Based Loss Recovery for Reliable Multicast Transmission", IEEE / ACM Transactions on Networking, IEEE Inc. New York, US, Vvol. 6, No. 4, Aug. 1, 1998, pp. 349-361.
Ozden, B. et al.: "A Low-Cost Storage Service for Movie on Demand Databases," Proceedings of the 20th Very Large DataBases (VLDB) Conference, Santiago, Chile (1994).
PA. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).
Pantos R et al., "HTTP Live Streaming; draft-pantos-http-1ive-streaming-OT.txt ", HTTP Live Streaming; Draft-Pantos-HTTP-Live-Streaming-01.Txt, Internet Engineering Task Force, IETF; StandardWorkingDraft, Internet Society (ISOC) 4, Rue Des Falaises CH—1205 Geneva, Switzerland, No. 1, Jun. 8, 2009, XP015062692.
Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).
Perkins, et al.: "Survey of Packet Loss Recovery Techniques for Streaming Audio," IEEE Network; Sep./Oct. 1998, pp. 40-48.
Petition decision for Petition Under 37 C.F.R. § 1.78 to Accept an Unintentionally Delayed Priority Claim under 35 U.S.C. § 120 in U.S. Pat. No. 7,532,132, dated Jul. 21, 2011, 2 pages.
Petition under 37 C.F.R. § 1.78 to Accept an Unintentionally Delayed Priority Claim under 35 U.S.C. § 120 in U.S. Pat. No. 7,532,132, dated May 27, 2011, 2 pages.
Plank J. S., "A Tutorial on Reed-Solomon Coding for Fault-Tolerance I N RAID-Like Systems", Software Practice & Experience, Wiley & Sons, Bognor Regis, GB, vol. 27, No. 9, Sep. 1, 1997, pp. 995-1012, XP00069594.
Pless and WC Huffman Eds V S: Algebraic geometry codes, Handbook of Coding Theory, 1998, pp. 871-961, XP002300927.
Pursley, et al.: "Variable-Rate Coding for Meteor-Burst Communications," IEEE Transactions on Communications, US, IEEE Inc. New York (1989) vol. 37, No. 11, pp. 1105-1112 XP000074533.
Pursley, M. et al.: "A Correction and an Addendum for Variable-Rate Coding for Meteor-Burst Communications," IEEE Transactions on Communications, vol. 43, No. 12 pp. 2866-2867 (Dec. 1995).
Pyle, et al., "Microsoft http smooth Streaming: Microsoft response to the Call for Proposal on httpstreaming", 93 MPEG Meeting; Jul. 26, 2010-Jul. 30, 2010; Geneva; (Motion Picture Expert Group or ISO/IEC JTC1/SCE29/WG11), No. M17902, Jul. 22, 2010, XP030046492.
QUALCOMM Europe S A R L: "Baseline Architecture and Definitions for HTTP Streaming", 3GPP Draft; S4-090603_HTTP_Streaming_Architecture, 3rd Generation Partnership Project (3GPP), Mobile Competence Centre; 650, Route Des Lucioles; F-06921 Sophia-Antipolis Cedex; France, no. Kista; Aug. 12, 2009, XP050356889.
QUALCOMM Incorporated: "Use Cases and Examples for Adaptive httpstreaming", 3GPP Draft; 54-100408-UseCases-HSD, 3rd Generation Partnership Project (JGPP), Mobile Competence Centre; 650, Route Des Lucioles; F-06921 Sophia-Antipolis Cedex; France, vol. SA WG4, no. Prague, Czech Republic; Jun. 21, 2010, Jun. 17, 2010, XP050438085, [retrieved on Jun. 17, 2010].
Rangan, et al., "Designing an On-Demand Multimedia Service," IEEE Communication Magazine, vol. 30, pp. 56-64, (Jul. 1992).
Research in Motion UK Limited: "An MPD delta file for httpstreaming", 3GPP Draft; S4-100453, 3rd Generation Partnership Project (SGPP), Mobile Competence Centre; 650, Route Des Lucioles; F-06921 Sophia-Antipolis Cedex; France, vol. SA WG4, no. Prague, Czech Republic; Jun. 21, 2010, Jun. 16, 2010, XP050438066, [retrieved on Jun. 16, 2010].
Rhyu, et al., "Response to Call for Proposals on httpstreaming of MPEG Media", 93 MPEG Meeting; Jul. 26, 2010-Jul. 30, 2010; Geneva; (Motion Picture Expert Group or ISO/IEC JTC1/SCE29/WG11) No. M17779, Jul. 26, 2010, XP030046369.
Rizzo, L. "Effective Erasure Codes for Reliable Computer Communication Protocols," Computer Communication Review, 27 (2) pp. 24-36 (Apr. 1, 1997), XP000696916.
Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).
Roca, V., et, al. "Low Density Parity Check (LDPC) Staircase and Triangle Forward Error Correction (FEC) Schemes", IETF RFC 5170 (Jun. 2008), pp. 1-34.
Rost, S. et al., "The Cyclone Server Architecture: streamlining delivery of popular content," 2002, Computer Communications, vol. 25, No. 4, pp. 1-10.
Roth, R., et al., "A Construction of Non-Reed-Solomon Type MDS Codes", IEEE Transactions of Information Theory, vol. 35, No. 3, May 1989, pp. 655-657.
Roth, R., "On MDS Codes via Cauchy Matrices", IEEE Transactions on Information Theory, vol. 35, No. 6, Nov. 1989, pp. 1314-1319.
Schwarz, Heiko et al., "Overview of the Scalable Video Coding Extension of the H.264/AVC Standard", IEEE Transactions on Circuits and Systems for Video Technology, vol. 17, No. 9, Sep. 2007, pp. 1103-1120.
Seshan, S. et al., "Handoffs in Cellular Wireless Networks: The Daedalus Implementation and Experience," Wireless Personal Communications, NL; Kluwer Academic Publishers, vol. 4, No. 2 (Mar. 1, 1997) pp. 141-162, XP000728589.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T REC. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.
Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.org/citation.cfm"id=1148681>.
Shokrollahi et al., "Design of Efficient Easure Codes with Differential Evolution", IEEE International Symposium on Information Theory, Jun. 25, 2000, pp. 5-5.
Sincoskie, W. D., "System Architecture for Large Scale Video on Demand Service," Computer Network and ISDN Systems, pp. 155-162, (1991).
Stockhammer, "WD 0.1 of 23001-6 Dynamic Adaptive Streaming over HTTP (DASH)", MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.
Sullivan et al., Document: JVT-AA007, "Editors' Draft Revision to ITU-T Rec. H.264|ISO/IEC 14496-10 Advanced Video Coding—In Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29- Feb. 3, 2009, pp. 1-683, http://wftp3.itu.int/av-arch/jvt-site/2009_01_Geneva/JVT-AD007.zip.
Sun, et al., "Seamless Switching of Scalable Video Bitstreams for Efficient Streaming," IEEE Transactions on Multimedia, vol. 6, No. 2, Apr. 2004, pp. 291-303.
Telefon AB LM Ericsson, et al., "Media Presentation Description in httpstreaming", 3GPP Draft; 54-100080-MPD, 3rd Generation Partnership Project (3GPP), Mobile Competence Centre; 650, Route Des

(56) References Cited

OTHER PUBLICATIONS

Lucioles; F-06921 Sophia-Antipolis Cedex; France, vol. SA WG4, no. St Julians, Malta; Jan. 25, 2010, Jan. 20, 2010, XP050437773, [retrieved on Jan. 20, 2010].

Thomas Wiegand, et al., "Joint Draft ITU-T Rec. H.264 | ISO/IEC 14496-10 / Amd.3 Scalable video coding", Joint Video Team (JVT) of ISO/IEC MPEG & ITU-T VCEG (ISO/IEC JTC1/SC29/WG11 and ITU-T SG16 Q.6) 24th Meeting: Geneva, Switzerland, Jun. 29-Jul. 5, 2007, pp. 1-559.

Tsunoda T., et al., "Reliable Streaming Contents Delivery by Using Multiple Paths," Technical Report of the Institute of Electronics, Information and Communication Engineers, Japan, Mar. 2004, vol. 103, No. 692, pp. 187-190, NS2003-331, IN2003-286.

U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8, 2011.
U.S. Appl. No. 13/205,565, by Ying Chen et al., filed Aug. 8, 2011.
U.S. Appl. No. 13/205,574, by Ying Chen et al., filed Aug. 8, 2011.

Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010, XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].

Viswanathan, et al., "Metropolitan area video-on-demand services using pyramid broadcasting", Multimedia Systems, 4(4): 197-208 (1996).

Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).

Viswanathan, Subramaniyam R., "Publishing in Wireless and Wireline Environments," Ph.D Thesis, Rutgers, The State University of New Jersey (Nov. 1994), 180pages.

Wang,"On Random Access", Joint Video Team (JVT) of ISO/IEC MPEG & ITU-T VCEG (ISO/IEC JTC1|SC29/WG11 and ITU-T SG16 Q.6), 4th Meeting: Klagenfurt, Austria, Jul. 22-26, 2002, p. 13.

Watson, M., et, al. "Asynchronous Layered Coding (ALC) Protocol Instantiation", IETF RFC 5775, pp. 1-23, (Apr. 2010).

Wenger, et al., RFC 3984, "RTP Payload Format for H.264 Video," Feb. 2005, 84 pp.

Wong, J.W., "Broadcast delivery", Proceedings of the IEEE, 76(12): 1566-1577, (1988).

Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.

Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.

Ying Chen et al: "Response to the CfP on HTTP Streaming: Adaptive Video Streaming based on AVC", 93 MPEG Meeting; Jul. 26, 2010-Jul. 30, 2010; Geneva; (Motion Picture Expert Group or ISO/IEC JTC1/SC29/WG11), No. M17909, Jul. 26, 2010, XP030046499.

Zorzi, et al.: "On the Statistics of Block Errors in Bursty Channels," IEEE Transactions on Communications, vol. 45, No. 6, Jun. 1997, pp. 660-667.

3rd Generation Partnership Project, Technical Specification Group Services and System Aspects Transparent end-to-end packet switched streaming service (PSS), 3GPP file format (3GP) (Release 9), 3GPP Standard, 3GPP TS 26.244, 3rd Generation Partnership Project (3GPP), Mobile Competence Centre, 650, Route Des Lucioles, F-06921 Sophia-Antipolis Cedex, France, No. V8.1.0, Jun. 1, 2009, pp. 1-52, XP050370199.

Cataldi et al., "Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.

Gracie et al., "Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPROC.2007.895197.

Huawei et al., "Implict mapping between CCE and PUCCH for ACK/NACK TDD", 3GPP Draft; R1-082359, 3rd Generation Partnership Project (3GPP), Mobile Competence Centre; 650, Route Des Lucioles; F-06921 Sophia-Antipolis Cedex; France, vol. Ran WG1, no. Warsaw, Poland, Jun. 24, 2008, XP050110650, [retrieved on Jun. 24, 2008].

International Search Report and Written Opinion—PCT/US2012/024737—ISA/EPO—May 11, 2012.

Kimura et al., "A Highly Mobile SDM-0FDM System Using Reduced-Complexity-and-Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.

Luby QUALCOMM Incorporated, "Universal Object Delivery using RaptorQ; draft-luby-uod-raptorq-OO.txt", Internet Engineering Task Force (IETF), StandardWorkingDraft, Internet Society (ISOC), Mar. 7, 2011, pp. 1-10, XP015074424, [retrieved on Mar. 7, 2011].

Mackay, "Fountain codes Capacity approaching codes design and implementation", IEE Proceedings: Communications, Dec. 9, 2005, pp. 1062-1068, vol. 152, No. 6, Institution of Electrical Engineers, XP006025749, ISSN: 1350-2425, DOI: 10.1049/IP-COM:20050237.

Pantos, "HTTP Live Streaming draft-pantos-http-live-streaming-02", Informational, Internet-Draft, Intended status: Informational, Expires: Apr. 8, 2010, http://tools.ietf.org/html/draft-pantos-http-live-streaming-02, pp. 1-20, Oct. 5, 2009.

RealNetworks Inc, et al., "Format for httpstreaming Media Presentation Description", 3GPP Draft; S4-100020, 3rd Generation Partnership Project (3GPP), Mobile Competence Centre; 650, Route Des Lucioles; F-06921 Sophia-Antipolis Cedex; France, vol. SA WG4, no. S t Julians, Malta; Jan. 25, 2010, Jan. 20, 2010, XP050437753, [retrieved on Jan. 20, 2010].

Shacham: "Packet Recovery and Error Correction In High-Speed Wide-Area Networks," Proceedings of the Military Communications Conference. (Milcom), US, New York, IEEE, vol. 1, pp. 551-557 (1989) XP000131876.

Todd, "Error Correction Coding: Mathematical Methods and Algorithms", Mathematical Methods and Algorithms, Jan. 1, 2005, pp. 451-534, Wiley, XP002618913.

Wiegand T et al.," WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010.

Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, CH, Nov. 21-30, 2011, pp. 259.

Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27-May 7, 2012, JCTVC-I1003_d21, pp. 290.

Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.

Bross et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.

Bross et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.

(56) References Cited

OTHER PUBLICATIONS

"International Preliminary Report on Patentability—PCT/US2011/044284, The International Bureau of WIPO—Geneva, Switzerland, Oct. 8, 2012".
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Jiang., File Format for Scalable Video Coding, PowerPoint Presentation for CMPT 820, Summer 2008.
Supplementry European Search Report—EP08746007—Search Authority—Munich—Sep. 27, 2012.
Wiegand et al., "WD3: Working Draft 3 of High-Efficiency Video Coding," Document JCTVC-E603, 5th Meeting: Geneva, CH, Mar. 16-23, 2011,193 pp.
Wiegand T. et al., "WD2: Working Draft 2 of High-Efficiency Video Coding", Jan. 28, 2011, No. JCTVC-D503, Jan. 28, 2011, XP002679642, Retrieved from the Internet: URL: http://wftp3.itu.int/av-arch/jctvc-site/2011_01_D_Daegu/ [retrieved on Jul. 11, 2012].
Yamanouchi N., et al., "Internet Multimedia Transmission with Packet by Using Forward Error Correction," Proceedings of DPS Workshop, The Information Processing Society of Japan, Dec. 6, 2000, vol. 2000, No. 15, pp. 145-150.
Anonymous: "Technologies under Consideration", 100. MPEG Meeting;Apr. 30, 2012-May 4, 2012; Geneva; (Motion Picture Expert Group or ISO/IEC JTC1 /SC29/WG11),, No. N12682, Jun. 7, 2012, XP030019156.
Gil A., et al., "Personalized Multimedia Touristic Services for Hybrid Broadcast/Broadband Mobile Receivers," IEEE Transactions on Consumer Electronics, 2010, vol. 56 (1), pp. 211-219.
Hannuksela M.M., et al., "DASH: Indication of Subsegments Starting with SAP", 97. MPEG Meeting; Jul. 18, 2011-Jul. 22, 2011; Torino; (Motion Picture Expert Group or ISO/IEC JTC1/SC29/WG11) No. m21096, Jul. 21, 2011, XP030049659.
Hannuksela M.M., et al., "ISOBMFF: SAP definitions and 'sidx' box", 97. MPEG Meeting; Jul. 18, 2011-Jul. 22, 2011; Torino; (Motion Picture Expert Group or ISO/IEC JTC1/SC29/WG11) No. m21435, Jul. 22, 2011, XP030049998.
Li, M., et al., "Playout Buffer and Rate Optimization for Streaming over IEEE 802.11 Wireless Networks", Aug. 2009, Worcester Polytechnic Institute, USA.
Roumy A., et al., "Unequal Erasure Protection and Object Bundle Protection with the Generalized Object Encoding Approach", Inria-00612583, Version 1, Jul. 29, 2011, 25 pages.
Stockhammer T., et al., "DASH: Improvements on Representation Access Points and related flags", 97. MPEG Meeting; Jul. 18, 2011-Jul. 22, 2011; Torino; (Motion Picture Expert Group or ISO/IEC JTC1/SC29/WG11) No. m20339, Jul. 24, 2011, XP030048903.
Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.
3GPP TSG-SA4 #57 S4-100015, IMS based PSS and MBMS User Service extensions, Jan. 19, 2010, URL : http://www.3gpp.org/ftp/tsg_sa/WG4_CODEC/TSGS4_57/docs/S4-100015.zip.
3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010,p. 85-102,URL,http://www.3gpp.org/ftp/TSG_SA/WG4_CODEC/TSGS4_59/Docs/S4-100511.zip, 26234-930.zip.
Lee, J.Y., "Description of Evaluation Experiments on ISO/IEC 23001-6, Dynamic Adaptive Streaming over HTTP", ISO/IEC JTC1/SC29/WG11MPEG2010/N11450, Jul. 31, 2010, 16 pp.
Luby M., "LT Codes", Foundations of Computer Science, 2002, Proceedings, The 43rd Annual IEEE Symposium on, 2002.
Morioka S., "A Verification Methodology for Error Correction Circuits over Galois Fields", Tokyo Research Laboratory, IBM Japan Ltd, pp. 275- 280, Apr. 22-23, 2002.

QUALCOMM Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc_MBS/Docs_AHI/S4-AHI170.zip, S4-AH170_CR_AdaptiveHTTPStreaming-Full.doc.
QUALCOMM Incorporated: "Corrections to 3GPP Adaptive HTTP Streaming", 3GPP TSG-SA4 #59 Change Request 26.234 CR0172 S4-100403, Jun. 16, 2010, URL, http://www.3gpp.org/FTP/tsg_sa/WG4_CODEC/TSGS4_59/Docs/S4-100403.zip, S4-100403_CR_26234-0172-AdaptiveHTTPStreaming-Rel-9.doc.
3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/etsi_ts/126300_126399/126346/06.01.00_60/ts_126346v060100p.pdf.
Anonymous: "Technologies under Consideration", 98. MPEG Meeting; Nov. 28, 2011-Dec. 2, 2011; Geneva; (Motion Picture Expert Group or ISO/IEC JTC1/SC29/WG11),, No. N12330, Dec. 3, 2011, XP030018825.
Anonymous: "Text of ISO/IEC IS 23009-1 Media Presentation Description and Segment Formats", 98. MPEG Meeting; Nov. 28, 2011-Dec. 2, 2012; Genega; (Motion Picture Expert Group or ISO/IEC JTC1/SC29/WG11),, No. N12329, Jan. 6, 2012, XP030018824.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
"Digital Video Broadcasting (DVB); Framing structure, channel coding and modulation for digital terrestrial television; ETSI EN 300 744" ETSI Standards, Lis, Sophia Antipolis Cedex, France, V1.6.1, pp. 9, Jan. 10, 2009 (Jan. 2009).
Kim J., et al., "Enhanced Adaptive Modulation and Coding Schemes Based on Multiple Channel Reportings for Wireless Multicast Systems", 62nd IEEE Vehicular Technology Conference, VTC-2005-Fall, Sep. 25-28, 2005, vol. 2, pp. 725-729, XP010878578, DOI: 1 0.11 09/VETECF.2005.1558019, ISBN: 978-0-7803-9152-9.
Makoto N., et al., "On Tuning of Blocking LU decomposition for VP2000 series" The 42th Information Processing Society of Japan Conference (1st term in 1991), Feb. 25, 1991, pp. 71-72, 4B-8.
Miller G., et al., "Bounds on the maximum likelihood decoding error probability of low density parity check codes", Information Theory, 2000. Proceedings. IEEE International Symposium on, 2000, p. 290.
Moriyama, S., "5. Present Situation of Terrestrial Digital Broadcasting in Europe and USA", Journal of the Institute of Image Information and Television Engineers, Nov. 20, 1999, vol. 53, No. 11, pp. 1476-1478.
Muramatsu J., et al., "Low density parity check matrices for coding of multiple access networks", Information Theory Workshop, 2003. Proceedings. 2003 IEEE , Apr. 4, 2003, pp. 304-307.
QUALCOMM Incorporated: "RaptorQ Technical Overview", pp. 1-12, Oct. 1, 2010.
Samukawa, H. "Blocked Algorithm for LU Decomposition" Journal of the Information Processing Society of Japan, Mar. 15, 1993, vol. 34, No. 3, pp. 398-408.
3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3rd Generation Partnership Project (3GPP), Mobile Competence Centre; 650, Route Des Lucioles; F-06921 Sophia-Antipolis Cedex; France, vol. SA WG4, No. V10.0.0, Jun. 17, 2011 (2011-06-17), pp. 1-94, XP050553206, [retrieved on 2011-06-17].
ATIS: "PTV Content on Demand Service", IIF-WT-063R44, Nov. 11, 2010, pp. 1-124, XP055045168, Retrieved from the Internet: URL:ftp://vqeg.its.bldrdoc.gov/Documents/VQEG_Atlanta_Nov10/MeetingFiles/Liaison/IIF-WT-063R44_Content_on_Demand.pdf [retrieved on Nov. 22, 2012].
Bouazizi I., et al., "Proposals for ALC/FLUTE server file format (14496-12Amd.2)", 77. MPEG Meeting; Jul. 17, 2006-Jul. 21, 2006;

(56) References Cited

OTHER PUBLICATIONS

Klagenfurt; (Motion PictureExpert Group or ISO/IEC JTC1/SC29/WG11), No. M13675, Jul. 12, 2006, XP030042344, ISSN: 0000-0236.
Frojdh P., et al., "Study on 14496-12:2005/PDAM2 ALU/ FLUTE Server File Format", 78.MPEG Meeting; Oct. 23, 2006-Oct. 27, 2006; Hangzhou: (Motion Picturexpert Group or ISO/ IEC JTC11SC29/WG11),, No. M13855, Oct. 13, 2006, XP030042523, ISSN: 0000-0233.
International Search Report and Written Opinion—PCT/US2012/053394—ISA/EPO—Feb. 6, 2013.
Luby et al., RaptorQ Forward Error Correction Scheme for Object Delivery draft-ietf-rmt-bb-fec-raptorq-00, Qualcomm, Inc. Jan. 28, 2010.
Michael G et al., "Improved low-density parity-check codes using irregular graphs", Information Theory, IEEE Transactions on,Feb. 2001,vol. 47, No. 2,pp. 585-598.
Motorola et al: "An Analysis of DCD Channel Mapping to Boast File Delivery Sessions; OMA-CD-DCD-2007-0112-INP_DCD_Channel_Mapping_to_BCAST_File_Delivery", OMA-CD-DCD-2007-0112-INP_DCD_Channel_Mapppi ng_To_BCAST_FILE_Delivery, Open Mobile Alliance (OMA), 4330 La Jolla Village Dr., Suite 110 SAN Diego, CA 92122; USA Oct. 2, 2007, pp. 1-13, XP064036903.
Ohashi A et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Schulzrinne, et al., "Real Time Streaming Protocol (RTSP)" Network Working Group, Request for Comments: 2326, Apr. 1998, pp. 1-92.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
Luby M., "Simple Forward Error Correction (FEC) Schemes," draft-luby-rmt-bb-fec-supp-simple-00.txt, pp. 1-14, Jun. 2004.
Gerard F., et al., "HTTP Streaming MPEG media—Response to CFP", 93. MPEG Meeting, Geneva Jul. 26, 2010 to Jul. 30, 2010.
Chikara S., et al., "Add-on Download Scheme for Multicast Content Distribution Using LT Codes", IEICE. B, Communications, Aug. 1, 2006, J89-B (8), pp. 1379-1389.
Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.
Tetsuo M., et al., "Comparison of Loss Resilient Ability between Multi-Stage and Reed-Solomon Coding", Technical report of IEICE. CQ, Communication Quality, vol. 103 (178), Jul. 4, 2003, pp. 19-24.
Watson M., et al., "Forward Error Correction (FEC) Framework draft-ietf-fecframe-framework-11," 2011, pp. 1-38, URL,http://tools.ietf.org/pdf/draft-ietf-fecframe-framework-11.pdf.
Watson M., et al., "Raptor FEC Schemes for FECFRAME draft-ietf-fecframe-raptor-04," 2010, pp. 1-21, URL,http://tools.ietf.org/pdf/draft-ietf-fecframe-raptor-04.pdf.
QUALCOMM Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.
Ramsey B, "HTTP Status: 206 Partial Content and Range Requests," May 5, 2008 obtained at http://benramsey.com/blog/2008/05/206-partial-content-and-range-requests/.

\* cited by examiner

CODE GENERATOR AND DECODER FOR COMMUNICATIONS SYSTEMS OPERATING USING HYBRID CODES TO ALLOW FOR MULTIPLE EFFICIENT USES OF THE COMMUNICATIONS SYSTEMS

CROSS-REFERENCES

This is a continuation application of U.S. patent application Ser. No. 11/747,191, filed May 10, 2007, which claims priority from and is a non-provisional of U.S. Provisional Patent Application No. 60/799,536 filed May 10, 2006.

The following references are include here and are incorporated by reference for all purposes:

U.S. Pat. No. 6,307,487 entitled "Information Additive Code Generator and Decoder for Communication Systems" issued to Luby (hereinafter "Luby I");

U.S. Published Patent Application No. 2005/0257106 published Nov. 17, 2005 and entitled "File Download and Streaming System" to Luby, et al. (hereinafter "Luby II");

U.S. Pat. No. 7,068,729 entitled "Multi-Stage Code Generator and Decoder for Communication Systems" issued to Shokrollahi, et al. (hereinafter "Shokrollahi I");

U.S. Published Patent Application No. 2006/0036930 published Feb. 16, 2006 and entitled "Method and Apparatus for Fast Encoding of Data Symbols According to Half-Weight Codes" to Luby, et al. (hereinafter "Luby III"); and U.S. Pat. No. 6,856,263 entitled "Systems and Processes for Decoding Chain Reaction Codes Through Inactivation" issued to Shokrollahi, et al. (hereinafter "Shokrollahi II").

FIELD OF THE INVENTION

The present invention relates to encoding and decoding data in communications systems, and more specifically to communication systems that encode and decode data to account for errors and gaps in communicated.

BACKGROUND OF THE INVENTION

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity, which characterizes most physically realizable systems, one concern is how to deal with data that is lost or corrupted in transmission. Lost data (erasures) are often easier to deal with than corrupted data (errors) because the recipient cannot always recognize when the transmitted data has been corrupted.

Many error-correcting codes have been developed to correct erasures and/or errors. Typically, the particular code used is chosen based on some information about the infidelities of the channel through which the data is being transmitted, and the nature of the data being transmitted. For example, where the channel is known to have long periods of infidelity, a burst error code might be best suited for that application. Where only short, infrequent errors are expected, a simple parity code might be best.

"Communication", as used herein, refers to data transmission, through space and/or time, such as data transmitted from one location to another or data stored at one time and used at another. The channel is that which separates the sender and receiver. Channels in space can be wires, networks, fibers, wireless media, etc. between a sender and receiver. Channels in time can be data storage devices. In realizable channels, there is often a nonzero chance that the data sent or stored by the sender is different when it is received or read by the recipient and those differences might be due to errors introduced in the channel.

Data transmission is straightforward when a transmitter and a receiver have all of the computing power and electrical power needed for communications, and the channel between the transmitter and receiver is reliable enough to allow for relatively error-free communications. Data transmission becomes more difficult when the channel is in an adverse environment, or the transmitter and/or receiver has limited capability. In certain applications, uninterrupted error-free communication is required over long periods of time. For example, in digital television systems it is expected that transmissions will be received error-free for periods of many hours at a time. In these cases, the problem of data transmission is difficult even in conditions of relatively low levels of errors.

Another scenario in which data communication is difficult is where a single transmission is directed to multiple receivers that may experience widely different data loss conditions. Furthermore, the conditions experienced by one given receiver may vary widely or may be relatively constant over time.

One solution to dealing with date loss (errors and/or erasures) is the use of forward error correcting (FEC) techniques, wherein data is coded at the transmitter in such a way that a receiver can correct transmission erasures and errors. Where feasible, a reverse channel from the receiver to the transmitter allows for the receiver to relay information about these errors to the transmitter, which can then adjust its transmission process accordingly. Often, however, a reverse channel is not available or feasible, or is available only with limited capacity. For example, in cases in which the transmitter is transmitting to a large number of receivers, the transmitter might not be able to maintain reverse channels from all the receivers. In another example, the communication channel may be a storage medium.

Thus, data is transmitted chronologically forward through time, and causality precludes a reverse channel that can fix errors before they happen. As a result, communication protocols often need to be designed without a reverse channel or with a limited capacity reverse channel and, as such, the transmitter may have to deal with widely varying channel conditions without prior knowledge of those channel conditions.

In the case of a packet protocol used for data transport over a channel that can lose packets, a file, stream, or other block of data to be transmitted over a packet network is partitioned into equally-sized source symbols. Encoding symbols the same size as the source symbols are generated from the source symbols using an FEC code, and the encoding symbols are placed and sent in packets. The "size" of a symbol can be measured in bits, whether or not the symbol is actually broken into a bit stream, where a symbol has a size of M bits when the symbol is selected from an alphabet of $2^M$ symbols. In such a packet-based communication system, a packet oriented erasure FEC coding scheme might be suitable.

A file transmission is called reliable if it allows the intended recipient to recover an exact copy of the original file despite erasures in the network. A stream transmission is called reliable if it allows the intended recipient to recover an exact copy of each part of the stream in a timely manner despite erasures in the network. Both file transmission and stream transmission can instead be not entirely reliable, but somewhat reliable, in the sense that some parts of the file or stream are not recoverable or, for streaming, some parts of the stream might be recoverable but not in a timely fashion.

Packet loss often occurs because sporadic congestion causes the buffering mechanism in a router to reach its capacity, forcing it to drop incoming packets. Protection against erasures during transport has been the subject of much study.

In a system in which a single transmission is directed to more than one receiver, and in which different receivers experience widely different conditions, transmissions must be configured for the worst conditions between the transmitter and any receiver, i.e., it must be assumed that some receivers will not receive the transmission reliably.

Erasure codes are known which provide excellent recovery of lost packets in such scenarios. For example, Reed-Solomon codes are well known and can be adapted to this purpose. However, a known disadvantage of Reed-Solomon codes is their relatively high computational complexity. Chain reaction codes, including LT™ chain reaction codes and Raptor™ multi-stage chain reaction ("MSCR") codes, provide excellent recovery of lost packets, and are highly adaptable to varying channel conditions. See, for example, Luby I, which describes aspects of chain reaction codes, and Shokrollahi I, which describes aspects of multi-stage chain reaction codes. Herein, the term "chain reaction code" should be understood to include chain reaction codes or multi-stage chain reaction codes, unless otherwise indicated.

As a general rule, erasure codes that are capable of correcting large amounts of lost data have a greater cost in terms of computational complexity, device hardware and software complexity, and/or memory requirements than those codes which are designed only for very limited levels of errors. In particular, as is well known, a simple parity code can be used to correct a single lost symbol among a group of any given size. The complexity of encoding and decoding such a code is very low. Interleaved parity codes are well known as a technique for correcting bursts of lost symbols that are shorter than or equal to the interleave depth. Such codes also have very low encoding and decoding complexity.

A disadvantage of known techniques is that if losses for some receivers are such that a more powerful erasure correction code must be employed, then all receivers need to provide support for this powerful code, implying costs in terms of complexity, memory, etc. for all receivers. As a result, initial deployments of systems may be based on less complex and less powerful codes, with an objective of upgrading the system to more powerful codes as required.

The "flag day" problem is a well-known problem that is difficult to solve in practice. The flag day problem occurs in large communication systems involving many devices (senders and receivers) when it becomes necessary to upgrade all deployed devices (e.g., receivers) simultaneously in order to deploy an upgraded service. The flag day problem has delayed or prevented the implementation of a number of desirable upgrades to systems in cases in which the upgrade is characterized by the precondition that all devices need to be updated before the system will work correctly, i.e., the system will not even perform at pre-upgrade levels if some devices have been upgraded and other devices have not. It is therefore desirable that an upgrade path be designed to be more or less seamless, in that the system can function at least as well during the upgrade period as it did before the upgrade began, even when some of the devices have been upgraded and others have not. This can be a large problem if a full upgrade would take a prolonged period of time. In such cases, a seamless upgrade path is highly desirable but is often difficult to accomplish.

BRIEF SUMMARY OF THE INVENTION

According to one embodiment of the invention, a method of encoding data for transmissions from a source to a destination over a communications channel is provided. The method operates on an ordered set of source symbols and may generate zero or more redundant symbols from the source symbols, wherein data is encoded in a first step according to a first FEC code and in a second step, data is encoded according to a second FEC code, more complex than the first FEC code. The first FEC code might be a simple erasure code and the second a more complex erasure code. The first FEC code and/or the second FEC code might comprise coding known in the art. These steps result in two groups of encoded data in such a way that a low-complexity receiver may make use of one of the groups of encoded data while higher complexity receivers may make use of both groups of encoded data, providing more error protection than either FEC code alone.

According to another embodiment of the invention, a method of receiving data transmitted over a communications channel is provided, the method comprising the step of combining the two groups of data in such a way that a greater number of errors can be corrected than if each group of data were processed independently according to the decoding procedures associated with the two respective codes.

As will be clear to those of skill in the art upon review of this disclosure, the methods described herein can be naturally extended to support more than two distinct FEC codes, maintaining the property that, at the receiver, data from more than one of the transmitted codes can be combined in a way that provides for greater error correction than if the data were processed independently according to the procedures associated with the respective codes.

A better understanding of the nature and the advantages of the embodiments disclosed herein may be realized by reference to the remaining portions of the specification.

BRIEF DESCRIPTION OF THE DRAWINGS

A further understanding of the nature and the advantages of the inventions disclosed herein may be realized by reference to the remaining portions of the specification and the attached drawings.

DETAILED DESCRIPTION OF SPECIFIC EMBODIMENTS

Figure 1:
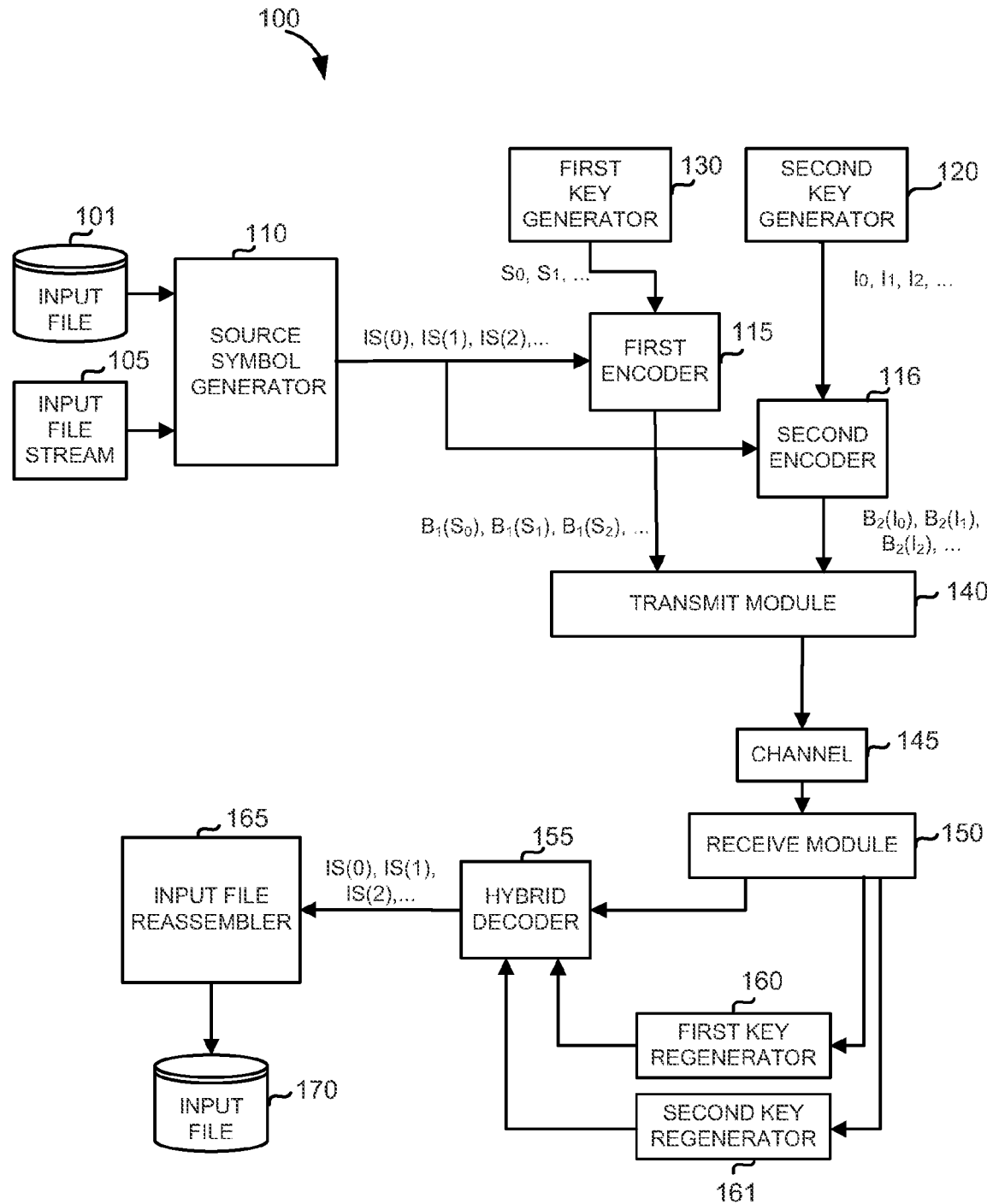
FIG. 1 is a block diagram of a communications system that can use the hybrid coding techniques described herein.

It is to be understood that the various functional blocks described herein may be implemented by a combination of hardware and/or software, and that in specific implementations some or all of the functionality of some of the blocks may be combined. Similarly, it is also to be understood that the various methods described herein may be implemented by a combination of hardware and/or software. Thus, where a computational step is performed, which might be described as "we then do step X", it should be understood that such descriptions include electronic hardware and/or software, or the like, performing those steps, typically as part of a communications process and not involving human or manual interaction.

In embodiments described herein, data to be encoded is segmented into "source blocks," each block comprising a number of packets of data, known as "source packets," with the number of source packets in a block possibly varying between blocks. For each source block, a number of "FEC repair" packets are generated by the encoder, the number also possibly varying between blocks. "Source packets" and "FEC repair", (or "repair") packets have the characteristic that a receiver receiving a combination of source and repair packets greater than or equal in number to the number of source packets has some non-zero probability of recovering all the source packets.

Seamless Upgrade Paths

There are a variety of reasons why a full upgrade may take a prolonged period of time. For example, it could be the case that older devices may not have the capability to support the upgraded system due to limitations in computational resources or memory. As another example, some devices are designed with the characteristic that they cannot be upgraded, and thus the upgrade can only occur when the device is replaced with a new device in which the upgrade is already installed. In other cases, even if in theory an upgrade is possible, it may in practice be too expensive or risky to upgrade a large number of devices because of the expense of installing upgrade software remotely on millions of devices and making sure that the upgrade is working correctly, as well as troubleshooting problems during installation, etc. Furthermore, if there are a large number of devices installed and they all need to be upgraded before the system is operational again, then it could be practically impossible to shut down the system during the upgrade, as would be the case with a large operational deployment of an IPTV service with millions of receivers, which could take days or weeks to fully upgrade.

In such cases, a seamless upgrade path is highly desirable but is often difficult to accomplish.

With respect to deployment of FEC protection of streaming data within a system that did not previously use FEC, there is a well-known seamless upgrade path. The way this is done is to design the application of the FEC in such a way that the original stream is still sent, and then additional FEC repair data is sent in a logically separate stream that can be used by upgraded receivers to support a much higher quality stream playout, while at the same time older receivers that have not been upgraded can simply ignore the FEC repair data and still operate as before using the original stream of data. The possibility of this seamless upgrade path is one of the primary reasons that systematic FEC codes are preferable for streaming applications. A systematic FEC code has the property that the original data is included and sent as part of the FEC encoded data, and in this context the additional FEC data that is generated and sent is called the FEC repair data.

However, as more and more receivers are added to a system, then the worst case channel conditions to which the FEC must be adapted become worse, and more powerful FEC codes are required. There is then no known efficient seamless update path, i.e., from a system that already uses FEC to a system that uses a more powerful FEC. For example, one such possible seamless upgrade path is to just simply encode the stream using both the original FEC code and the more powerful FEC code during the transition and to send the FEC repair data for both codes. However, this solution sends a lot more FEC repair data than is required for a given quality of protection. Another possible upgrade path is to simply stop sending the FEC repair data from the less powerful FEC code and only send the FEC repair data from the more powerful FEC code during the transition. However, this has the undesirable property that during the transition the older receivers that are not upgraded will receive a worse service during the upgrade transition than they did before the upgrade initiated. Thus, what is desired is an efficient and seamless upgrade path for introducing more powerful FEC codes in systems where less powerful FEC codes have already been deployed.

In another technique, FEC repair data is distributed across a number of "channels" where receivers may choose whether or not to receive each channel. Receivers experiencing good channel conditions may limit the number of channels received. For example, such a technique can be applied to wireless systems in which each channel corresponds to a different radio frequency or other means of multiplexing data. Another example occurs in the field of Internet Protocol networks where a channel may correspond to a multicast group which a receiver can leave or join as required.

One possible solution is to FEC encode the data to be transmitted twice, once with a low complexity FEC code and once with a more powerful FEC code, and then send the FEC repair data for the different FEC codes over different channels. It is possible that, within at least some of the system, both transmission channels are carried. In particular, in the case of wireless systems, both transmission channels are carried over the wireless link. In the case of Internet Protocol networks, both transmission channels may be carried as far as the last hop router before each receiver.

In one embodiment each receiver uses FEC repair data from only one of the two channels, i.e., the FEC repair data associated with one of the two FEC codes, even in the case of a receiver equipped with a FEC decoder for both FEC codes. In this embodiment, the quality of the decoded stream does not necessarily reflect the quality that could be obtained by using both FEC repair data streams to decode, and thus other embodiments may work better.

Receivers

In some embodiments, a receiver that is equipped with both FEC decoders receives and decodes using the FEC repair data from both channels, i.e., from both FEC codes. For example, a receiver may decode as much as possible of the original data stream alternatively using the FEC repair data from one of the two channels followed by using the FEC repair data from the other of the two channels, together with whatever original data is received. As another example the receiver may immediately combine the FEC repair data from both channels and use it together to decode the original data stream, e.g., if the FEC repair data for both channels is linear combinations of the original data then the receiver may solve a linear system of equations based on the combined set of FEC repair data received from both FEC codes, together with whatever original data is received. These are preferred embodiments, because they allow a seamless upgrade path. For example, an efficient seamless upgrade path may be enabled by a first FEC code that is simple and can generate only a few FEC repair symbols per original source block of data, using relatively simple procedures at the receiver to regenerate the missing pieces of the original source blocks of data from the FEC repair data, using limited expenditure of computational resources, memory etc., and a second FEC code that is more powerful and can generate more FEC repair symbols per original source block of data that may use more advanced procedures at a more sophisticated receiver to regenerate the missing pieces of the original source blocks of data by processing the combined FEC repair data from the first and second FEC codes.

During the deployment of systems such as those considered here, in which, for example, a single transmission is directed towards multiple receivers each experiencing different conditions in terms of data loss, it is common to provide support for receivers in phases, with those receivers experiencing low loss conditions receiving service at an earlier phase in the development of the system. This approach is advantageous in terms of capital investment, since deployment of complex and expensive functionality to deal with high loss cases can be delayed until the demand for and effectiveness of the system in question has been tested. Furthermore, during the early deployment phases of such systems, priority is often given to more fundamental operational issues.

Thus, another desirable property of such an FEC code is that encoding and decoding of the first group of packets also requires relatively low computational resources. This allows for development and deployment of lower cost transmitters and receivers during the early phases of system deployment.

Hybrid Coder

In this embodiment, the first repair packets sent for a block are generated using a low-complexity erasure code which is known to perform well in the case that only a very few source packets (perhaps as few as one) are lost. Additional repair packets are generated using a second erasure code. In one specific embodiment, the first code may be a single parity packet calculated across all of the source packets in the block, such as an FEC code specified in IETF RFC 2733 and the second code may be a chain reaction code, such as those described in Shokrollahi I or Luby I. In another specific embodiment, the first code may be a small number of repair packets from a high rate Reed-Solomon code. In another embodiment, the first code is a simple interleaved parity code and the second code may be a chain reaction code. In a further embodiment, the second code is a Reed-Solomon code.

At a receiver, which receives one or more repair packets of the first FEC code, decoding may first be attempted using a decoding method appropriate for the first FEC code. In the case where the first FEC code alone is not sufficient to recover all lost source packets at the receiver, received first FEC code repair packets may be combined with received repair packets from the second FEC code and used to recover lost source packets in such a way that the number of recovered source packets may be greater than if each FEC code were decoded independently and furthermore greater than if one code were processed first and the output of this operation used as input to the decoding operation of the second code.

Herein, coding methods that provide for two (or more) FEC codes wherein two (or more) of those codes can be used together are referred to herein as "hybrid code" methods. Some decoders, when receiving data encoded according to a hybrid code method, will decode using available source packets (where the coding is at least in part systematic; encoded packets for nonsystematic coding or the like would be used instead) and first repair packets containing symbols of a first FEC repair code, while other decoders could use first FEC code packets and second FEC code packets (and third, etc., where more than two are used). In yet other variations, the simple decoder uses more than one FEC code stream, but fewer code streams than the more complex decoder.

The use of hybrid code methods has an advantage over using the repair packets of the second code alone and independently of the first code repair packets, since a given quality target can be achieved with overall lower overhead.

The hybrid code approach has advantages in cases where the second FEC code does not perform well at very low overhead. Some advantages include that the resulting hybrid code is more flexible than the second FEC code alone, since the "same" code is applicable in both very low loss and higher loss scenarios. Another advantage, in cases where receivers experience variable loss rates, is that if a very low-complexity first code is chosen then only the first code needs to be processed when loss rates are low and the computational load (at that time) is very low. Where receivers designed are only for low-loss scenarios, they advantageously need only implement the first FEC code part of the hybrid code.

Some or all of the above advantages would be obtained in embodiments of encoders, decoders and/or communications system according to the present invention.

Relationship Between Packets and Symbols

As described above, forward erasure correction codes operate on symbols chosen from a fixed alphabet. For example, the symbols may be chosen from an alphabet of size $2^M$ in which case there is an obvious mapping between symbols and strings of M binary digits. Such symbols are hereinafter referred to as having a size of M bits. Data is often sent over a communications channel in the form of packets. In some cases, there is a one-to-one mapping between symbols and packets. In other cases, including for example those described in Luby II, packets may be larger than symbols, with a packet comprising several symbols. Additionally, symbols and packets may comprise the same data but the bit order and placement may differ, or additional information may be placed into the FEC symbols which is not contained within the packet, for example a binary representation of the packet length. Equally, data may be present in packets which is not present in the FEC symbols, for example information added to a packet to indicate which FEC symbols it contains or data that does not need to be protected by the FEC code, for example because it comprises fields that are not used or have the same value in every packet or because it could be recovered in other ways.

In the case of hybrid codes, to obtain some of the advantages, the symbols of the first code and those of the second code will have certain relationships. Specifically, a source symbol of the first code will comprise the data of one or more source symbols of the second code. It should be understood that the source symbols of the first code may be a different size from those of the second code, that there may be information in symbols of the first code that is not present in the symbols of the second code and that where a source symbol of the first code comprises the data of one of the source symbols of the first code this means only that knowledge of the source symbol of the second code could be obtained from knowledge of the source symbol of the first code and not, for example, that the source symbol of the first code contains a verbatim copy of the source symbol of the second code.

Relationship Between Source Blocks

Many forward error correction codes operate on discrete collections of source symbols, known as source blocks. For example, a source block may comprise all the source symbols of a file, or all the source symbols of a particular fragment in time of a streaming service.

In the case of hybrid codes, to obtain some of the advantages, the source blocks of the first code and those of the second code will have certain relationships. Specifically, the source blocks of the first code preferentially should each be a subset of a source block of the second code. More precisely, given a source block of the first code, a number of the source symbols of the second code may be obtained according to the section "Relationship between packets and symbols" herein and these source symbols preferentially should all be part of the same source block of the second code.

Figure 4:
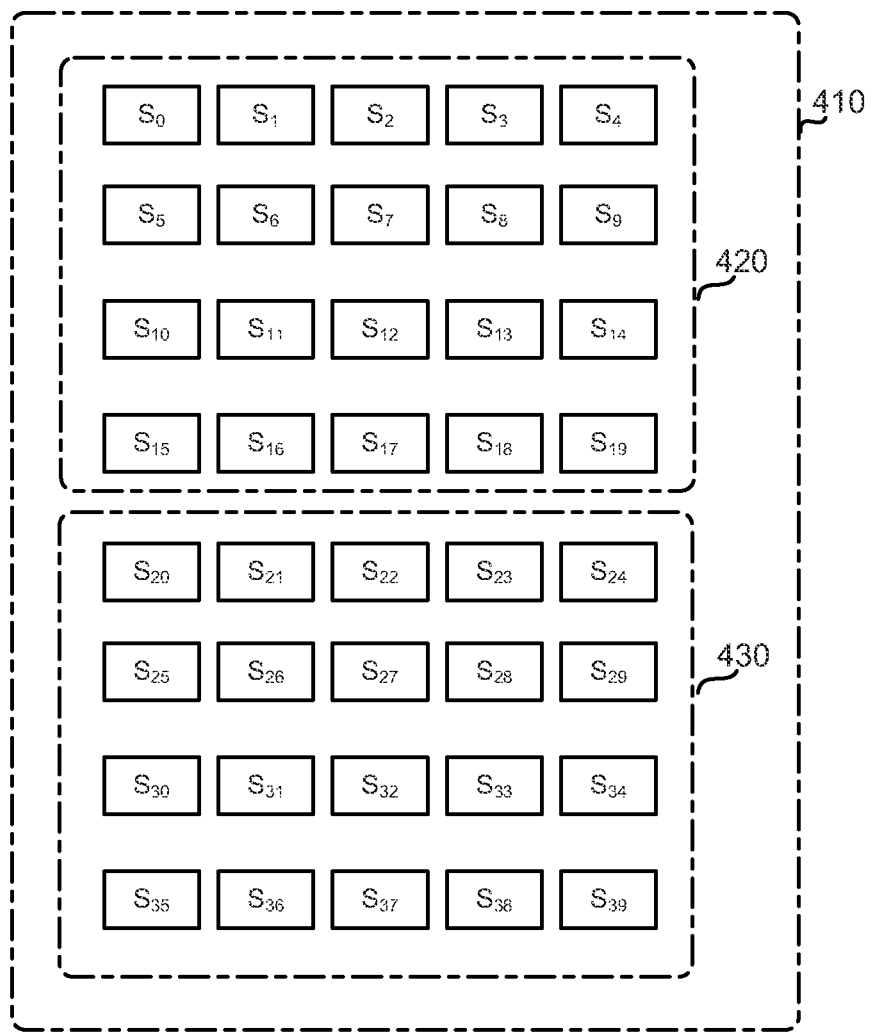
FIG. 4 is an illustration of an example of relationships between source blocks of a first code and a second code according to aspects of the present invention.

An example of a possible relationship between source blocks of the first and second codes is illustrated in FIG. 4, which shows a source block of a Second FEC code 410 constructed from 40 source packets, $S_0, S_1, \ldots, S_{39}$. Also shown are two source blocks of a First FEC code, 420 and 430, each constructed from 20 packets taken from the same set of 40 packets.

As will be apparent to those of skill in the art of FEC coding upon review of this disclosure, many other arrangements are possible. For example, the source blocks of the first FEC code need not each be the same size as each other and the source blocks of the second FEC code need not be the same size as each other. It need not be the case that every packet is a member of a single first FEC code source block and it need not be the case that every packet of a second FEC code source block is also a member of a first FEC code source block.

Generalized Matrix Description of Systematic Forward Erasure Correction Codes

We now describe a generalized method of encoding and decoding systematic forward erasure correction codes. As is well-known, a large class of codes can be represented in the form described here and encoded and decoded by the method described here. In some cases alternative methods exist which offer improvements in computational complexity, either at the encoder or decoder or both. The general method described here will later be used to describe the method by which repair packets of a first code can be combined with those of a second code. This method may be applied whether or not either of the codes are encoded or decoded using the generalized method or some other method.

In many forward erasure correction codes, each repair symbol can be expressed as a linear sum of the source symbols over some finite field. Methods for the use of such linear combinations within the field of FEC codes are well known and are described in detail for example in Shokrollahi I, Shokrollahi II and Luby III.

In such cases, a method of encoding is obtained by simply calculating the required linear combination for each repair symbol. This operation can be viewed as the operation of a matrix on a column vector comprising the source symbols, the matrix comprising a number of columns equal to the number of source symbols and one row for each repair symbol, where the entries of this row are the coefficients of the source symbols in the linear combination which is equal to that repair symbol. A method of decoding can be obtained by constructing a matrix comprising those rows of the encoding matrix corresponding to received repair symbols. The well-known method of Gaussian elimination can then be applied to recover the missing source symbols as linear combinations of the received symbols, if such recovery is possible at all.

In practice, many methods exist for performing calculations equivalent to those described above using fewer primitive operations than those required in the straightforward approach by making use of specific properties of the particular FEC code. Some such methods are taught by Shokrollahi I, Shokrollahi II and Luby III. In the description below, the generalized matrix description is used in the description of novel techniques which apply to a large number of different FEC codes, but it should be understood that in practice methods optimized for particular codes may be used in conjunction with the novel techniques described.

Erasure codes which can be represented in this form include the simple parity code in which there is a single repair packet for each source block, with the repair packet being constructed as the excusive OR (XOR) of the source packets, i.e., the linear sum of the source packets in the finite field GF(2). Another example is an interleaved parity code, in which there is a number, n, of repair packets, with indices 0, ..., n−1 where the repair packet with index i is equal to the sum of those source packets whose index s satisfies (s % n)=i.

Another example is a Reed-Solomon code, one example of which may be obtained if the matrix is a Vandermonde matrix.

Generalized Matrix Description of Certain Systematic Chain Reaction Codes

Also described herein is a generalized matrix description of certain systematic chain reaction codes in which columns of the matrix represent "intermediate symbols" and rows of the matrix represent "source," "repair," and "static" symbols.

The entries of such a matrix are taken from a finite field $GF(2^q)$, although in some regions of the matrix, the choice of elements may be restricted to those in the image of some smaller finite field, $GF(2^p)$ for p<q according to some embedding of $GF(2^p)$ into $GF(2^q)$.

This matrix expresses the relationships between source symbols and repair symbols, via the intermediate symbols, in the following way:

(1) There is one matrix row for each source symbol, which expresses that source symbol as a linear combination of the intermediate symbols; that is, the product of a row vector equal to the row in question with a column vector of the intermediate symbols is equal to the source symbol in question;

(2) There is one matrix row for each repair symbol, which expresses that repair symbol as a linear combination of the intermediate symbols; that is, the product of a row vector equal to the row in question with a column vector of the intermediate symbols is equal to the repair symbol in question;

(3) There are zero or more static rows, each of which identifies a linear combination of the intermediate symbols which is constrained to be equal to the zero symbol; that is, the product of a row vector equal to the row in question with a column vector of the intermediate symbols is equal to the zero symbol.

The combination of source symbols and static rows form an invertible matrix. Encoding can be performed by constructing the matrix comprising the rows corresponding to the static symbols and the source symbols, finding its inverse (for example, by Gaussian elimination), using this inverse to calculate the intermediate symbols from the source symbols. Once the intermediate symbols have been calculated then repair symbols may be constructed as linear combinations of the intermediate symbols as indicated by the matrix rows corresponding to the repair symbols.

Decoding can be performed by constructing the matrix comprising the rows corresponding to the static symbols and all received symbols (source and repair). If this matrix is of full rank, then an invertible sub-matrix can be found (for example by Gaussian elimination) which allows all the intermediate symbols to be recovered. The missing source symbols can then be constructed as the appropriate linear combinations of intermediate symbols.

Encoder Implementation

FIG. 1 is a block diagram of a communications system 100 that uses coding that might include the hybrid coding described herein.

In communications system 100, an input file 101, or an input stream 105, is provided to a source symbol generator 110. Source symbol generator 110 generates a sequence of one or more source symbols (IS(0), IS(1), IS(2), ...) from the input file or stream, with each source symbol having a value and a position (denoted in FIG. 1 as a parenthesized integer). As explained above, the possible values for source symbols, i.e., its alphabet, is typically an alphabet of $2^M$ symbols, so that each source symbol codes for M bits of the input file. In the case where the first FEC code and the second FEC code use source symbols of different sizes, then source symbol generator 110 may generate symbols of both sizes. The value or values of M is/are generally determined by the use of communication system 100, but a general purpose system might include a symbol sizes input for source symbol generator 110 so that the values of M can be varied from use to use. The output of source symbol generator 110 is provided to a first FEC code encoder 115 and a second FEC code encoder 116.

First key generator 130 produces a stream of keys $S_0$, $S_1$, . . . . The number of the keys generated is generally limited and depends on the specific embodiment of encoder 115. The generation of first FEC code keys will be subsequently described in more detail, as used for a first FEC code. Second key generator 120 generates a key for each output symbol to be generated by the second FEC code encoder 116. Each key may be generated so that a large fraction of the keys for the same input file are unique. For example, Luby I describes embodiments of key generators that can be used. The outputs of second key generator 120 are provided to the second FEC code encoder 116.

From each key S provided by the first key generator 110, encoder 115 generates an output symbol, with a value $B_1(I)$, from the source symbols provided by the source symbol generator. The operation of first encoder 115 is described in more detail below. The value of each output symbol is generated based on its key and on some function of one or more of the source symbols.

From each key I provided by the second key generator 120, encoder 116 generates an output symbol, with a value $B_2(I)$, from the source symbols provided by the source symbol generator. The operation of second encoder 116 will be described in more detail below. The value of each output symbol is generated based on its key and on some function of one or more of the source symbols, and possibly on or more redundant symbols that had been computed from the source symbols.

The collection of source symbols that give rise to a specific output symbol are referred to herein as the output symbol's "associated symbols" or just its "associates". The selection of the function (the "value function") and the associates is done according to a process described in more detail below. Typically, but not always, M is the same for source symbols and output symbols, i.e., they both code for the same number of bits.

It should be understood that in some cases the method by which the value of an output symbol is calculated may be simply be the application of the protection function across each of the associated symbols. In another case, a number of intermediate calculations may first be performed which calculate particular combinations of source symbols and application of the function across these intermediate values and the source symbols may be used to calculate the output symbols.

In some embodiments, the number K of source symbols is used by the first encoder 115 or second encoder 116 to select the associates. Note that the number K may be different for encoders 115 and 116 since the size of source symbols and construction of source blocks may be different. If K is not known in advance, such as where the input is a streaming file, K can be just an estimate. The value K might also be used by first encoder 115 or second encoder 116 to allocate storage for source symbols and any intermediate symbols generated by first encoder 115 or second encoder 116. It should be understood that storage for source symbols in particular may be shared between encoders 115 and 116.

Encoders 115 and 116 provides output symbols to a transmit module 140. In the case that both the first and second FEC codes are systematic codes, then either First Encoder 115 or Second Encoder 116 may be configured to suppress provision of those output symbols which comprise source data in order to avoid such symbols being provided more than once to the transmission channel. Transmit module 140 is also provided the key of each such output symbol from key generators 120 and 130. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoders 115 and 116 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a hybrid decoder 155, and any data module 150 receives about the keys of these output symbols is provided to a first key regenerator 160 and a second key regenerator 161. First key regenerator 160 regenerates the first keys for the received output symbols of the first FEC code and provides these keys to hybrid decoder 155. Second key regenerator 161 regenerates the second keys for the received output symbols of the second FEC code and provides these keys to hybrid decoder 155. \Hybrid decoder 155 uses the keys provided by first key regenerator 160 and second key regenerator 161 together with the corresponding output symbols, to recover the source symbols (again IS(0), IS(1), IS(2), . . . ). Decoder 155 provides the recovered source symbols to an input file reassembler 165, which generates a copy 170 of input file 101 or input stream 105.

Encoders 115 and 116 can encode data using techniques shown herein so that the FEC encoding has variable overhead.

As explained herein, the first and second FEC encoders are configured such that a decoder can extract information from both sets of FEC symbols, if they are available and the decoder is so configured or adapted, which another decoder that is not adapted to use the second set of FEC symbols can still recover errors using the first set of FEC symbols.

Hybrid Code Receiver Examples

Figure 2:
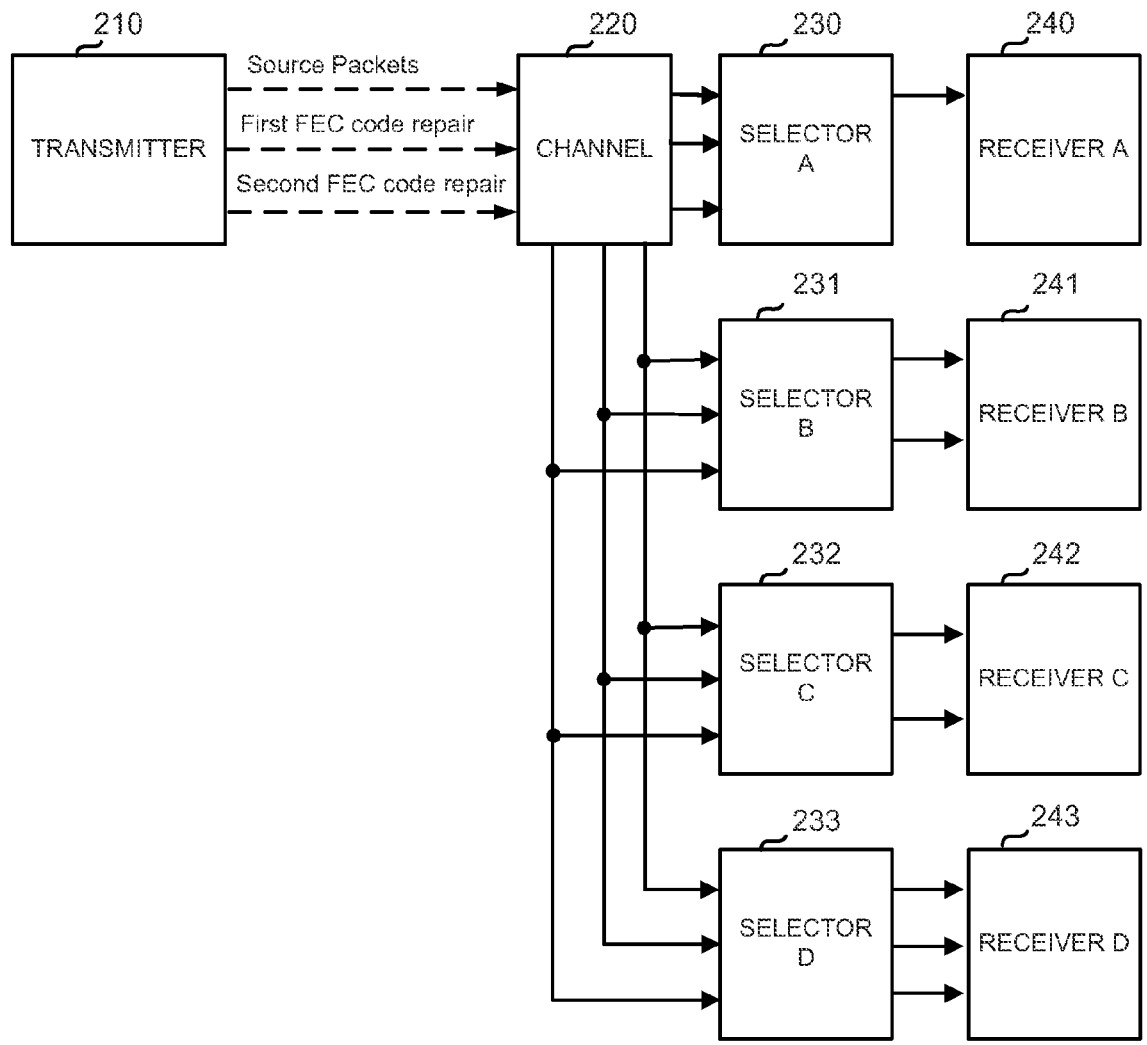
FIG. 2 is a block diagram showing a number of different receiver configurations supported by the communications system.

There are several forms of receiver that may receive and process a hybrid code. Some of these are now described with reference to FIG. 2. Transmitter 210 generates output symbols, including source symbols, first FEC code repair symbols and second FEC code repair symbols. Transmitter 210 may comprise for example elements 101, 105, 110, 130, 120, 115, 116 and 140 of FIG. 1.

Selector A 230 may receive source packets, first FEC code repair packets and second FEC repair packets from Channel 220 and provides only the source packets to Receiver A 240. Receiver A may receive source packets from Selector A 230 and if all source symbols are correctly received may recover the file or stream.

Selector B 231 may receive source packets, first FEC code repair packets and second FEC repair packets from Channel 220 and provides the source packets and the first FEC code repair packets to Receiver B 241. Receiver B 241 may receive source packets and first FEC code repair packets from Selector B 231. If not all source symbols are received, Receiver B 241 may apply a decoding operation to recover some or all of the missing source symbols by making use of the first FEC code repair packets.

Selector C 232 may receive source packets, first FEC code repair packets and second FEC repair packets from Channel 220 and provides the source packets and the second FEC code repair packets to Receiver C 242. Receiver C 242 may receive source packets and second FEC code repair packets from Selector C 232. If not all source symbols are received, Receiver C 242 may apply a decoding operation to recover some or all of the missing source symbols by making use of the second FEC code repair symbols.

Selector D 233 may receive source packets, first FEC code repair packets and second FEC code repair packets from Channel 220 and provides the source packets, the first FEC code repair packets and the second FEC code repair packets to Receiver D 243. Receiver D 243 may receive source packets, first FEC code repair packets and second FEC code repair packets from Selector D 233. If not all source symbols are received, Receiver D 243 may apply a decoding operation to recover some or all of the missing source symbols by making use of the first FEC code repair symbols, the second FEC code repair symbols or a combination of both the first and second FEC code repair symbols.

The choice of Selector and Receiver type is preferably based on the properties of the channel. For example, for a channel with very few errors it may be the case that the first FEC code alone is sufficient to recover the errors. In this case, receivers may not be provided with the capabilities required to receive and process the packets of the second FEC code. This may be an advantage as it might result in a simplified receiver design compared to a receiver capable of receiving both first and second FEC code packets and therefore the cost of designing and manufacturing such receivers may be lower.

Extensions to more than two codes should be apparent after reading this disclosure.

A receiver device may also behave according to different cases at different points in time. In particular a receiver device may change behavior between the four receiver types, Receiver A, Receiver B, Receiver C and Receiver D according to the type of Selector function that is providing it with packets. The type of Selector function may also change from time to time as is described further below.

The choice of Selector and Receiver type at any given time is preferably based on the properties of the channel. For example, for a channel with very few errors it may be the case that the first FEC code alone is sufficient to recover the errors. In this case receipt and processing of the second FEC code packets is unnecessary. Receipt and processing of the second FEC code packets at the receiver consumes resources at that receiver, for example memory to store the packets, CPU cycles to read them into memory and process them and bandwidth on the link bringing data into the receiver. Such resources may be consumed even if the packets are not eventually used for FEC decoding purposes. Therefore it is advantageous to avoid receipt and processing of these packets if they are known to be unnecessary due to the properties of the channel, since this allows those resources to be used for other tasks. Similarly, if errors on the channel are such they can be corrected using only the second FEC code then there is advantage if receipt and processing of the first FEC code packets can be avoided.

Furthermore, in some cases the errors on a channel may vary with time. In this case receivers may make a different choice of Selector and Receiver type from time to time based on the observed level of errors, in order to avoid as much as possible receipt and processing of unnecessary packets.

It may also be the case that the channel 220 effectively blocks forwarding of either First FEC code repair packets or Second FEC code repair packets. This behavior may be a property of the channel, may be based on configuration of network equipment or may be under the control of the receiver device.

An example of a case where the forwarding of packets by the channel is dependent on configuration of network equipment is a DSL network in which DSL equipment is configured with information controlling whether first FEC code packets and/or second FEC code packets should be forwarded onto each DSL line. This configuration may be based on the level of errors that are expected to occur on that line which in turn may be based on factors such as the length of the line.

An example of a case where the forwarding of packets by the channel is under the control of the receiver is an IP multicast network. In this case, packets are only forwarded by the network if the receiver has requested to join the multicast group to which they have been sent. In the case that the first FEC code repair packets and the second FEC Code repair packets are sent to different multicast groups then the reception of each kind of packet will be controlled by the receiver device. The receiver device may therefore make a selection of whether to receive first FEC code packets and second FEC code packets for example based on the observed level of errors or on its capabilities.

Additionally, once packets have been received, it is not necessarily the case that they are always required for decoding of a particular block. In some cases, the computational complexity of decoding using only the first FEC code may be different from the complexity of decoding using only the second FEC code. The computational complexity of decoding using both codes (the hybrid approach) may be different again. For example, decoding using only the first code may be relatively low in complexity, decoding using only the second code may be moderate in complexity and decoding using both codes may be high in complexity. Advantageously, a receiver may perform only the minimal required operations based on the level of losses experienced in each block.

For example, in the case of DSL networks, the number of lost packets in each block may be relatively low in number for most of the blocks, allowing the receiver to use only the first FEC code for decoding and therefore consuming very few computational resources for most of the blocks. Occasionally, there may be a sufficient number of lost packets within a block that they can only be recovered using the second FEC code packets, therefore consuming slightly more computational resources. Rarely, there may be a sufficient number of lost packets within a block that they can only be recovered using both types of FEC code packet, consuming higher computational resources but only on rare occasions.

There is considerable advantage in terms of overall computational resource usage when a hybrid code is used since the receiver is provided with several levels of error correction capability with the most commonly required capabilities requiring very low computational resources and higher computational resources only required in uncommon cases. By comparison, when only the first FEC code is available, computational resource usage is always low, but error correction capability deals with only the most common cases. Commonly, this is not sufficient since service quality targets require that even rare events should not cause errors after the Forward Error Correction has been applied.

For example, in IPTV systems, a common quality target is that there should be at most one visible artifact in some period of those, such as one hour. Since a single lost packet (after the Forward Error correction has been applied) can often cause a serious visible artifact, this target implies that the Forward Error Correction code must fail for at most one block in any hour or other period of time.

Conversely, if only the second FEC code packets are available, then error correction is sufficient to deal with less common cases, but computational complexity is moderate at all times.

The hybrid approach therefore has at least two advantages in this case. A first advantage is that computational complexity is on average low whilst simultaneously error correction capability is high. A second advantage is that the error correction capability is higher than if either code were used alone.

Decoding of Hybrid Codes

Figure 3:
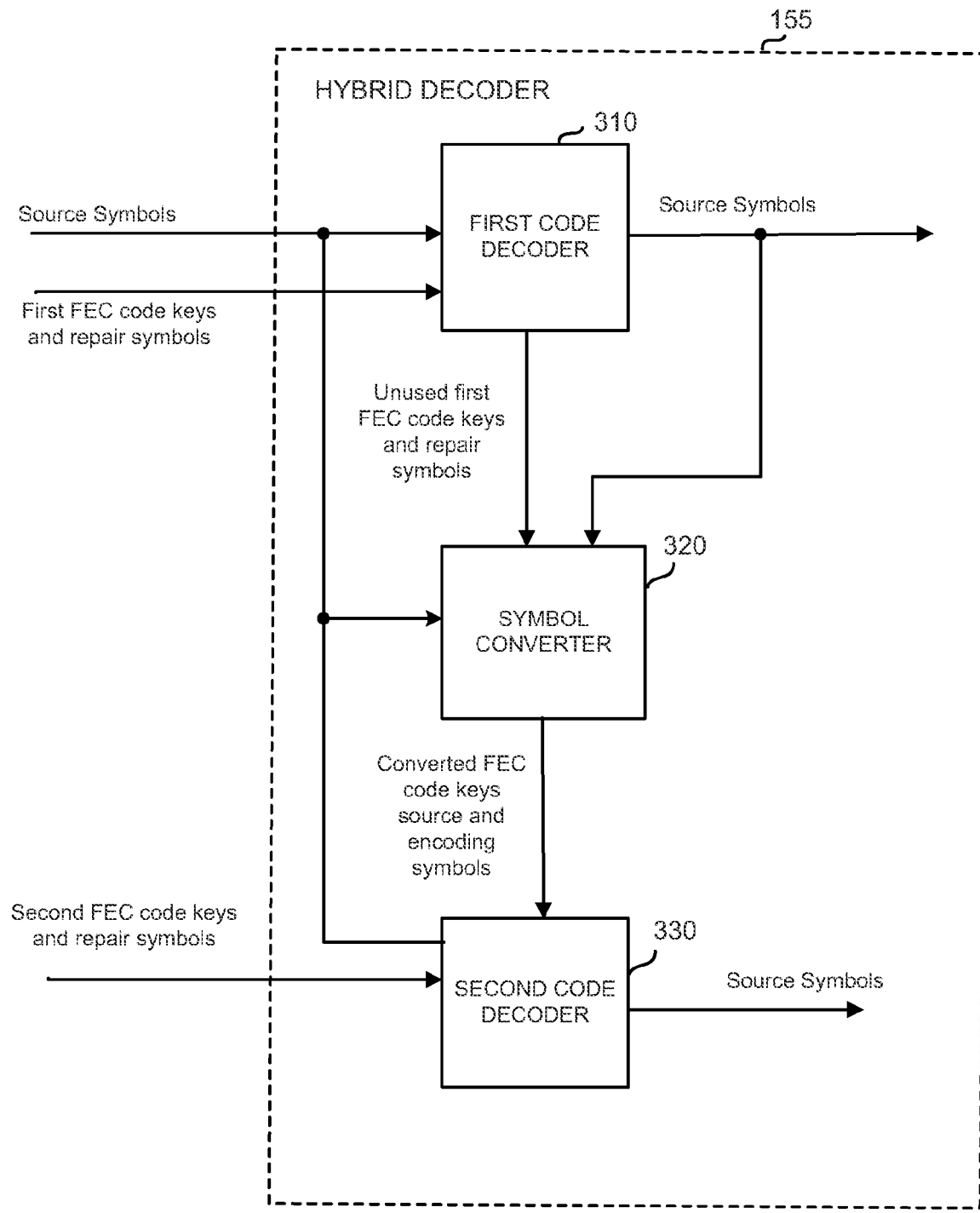
FIG. 3 is a block diagram of a decoder shown in greater detail.

FIG. 3 is a block diagram of decoder 155 shown in more detail. As illustrated there, the input to decoder 155 is a sequence of encoding symbols comprising source symbols, encoding symbols of a first FEC code, encoding symbols of a second FEC code, first FEC code keys from first key regenerator 160 and second code keys from key regenerator 161. The output of decoder 155 can be a sequence of source symbols.

Decoder 155 may comprise a first FEC decoder 310, a second FEC decoder 330 and a symbol converter 320. The input to the first FEC decoder 310 comprises source symbols, encoding symbols of a first FEC code and first FEC code keys from first key regenerator 160. The output of the first FEC decoder 310 can be source symbols, encoding symbols and first FEC code keys corresponding to the encoding symbols.

The input of the symbol converter 320, comprises source and repair symbols of the first FEC code and first FEC code keys corresponding to the encoding symbols. The output of the symbol converter 320 can be source and repair symbols suitable for use within the second code decoder and keys which describe the associated symbols for each supplied encoding symbol. These encoding symbols may have a set of associates distinct from the set of associates of any encoding symbol that may be generated by the Second FEC Encoder 116. The key associated with such an encoding symbol may also be different in type from the keys generated by the Second Key Generator 120. Herein the encoding symbols and keys provided by the Symbol Converter are referred to as "Converted FEC code keys and encoding symbols".

The input of the second FEC decoder 330 comprises source symbols, supplied directly to the Hybrid Decoder 155 or by the first FEC decoder 310, encoding symbols of the second FEC code, encoding symbols generated by the symbol converter 320, second FEC code keys generated by second FEC code key regenerator 161 and converted FEC code keys generated by symbol converter 320. The output of the second FEC decoder can be source symbols.

Symbol converter 320 transforms symbols of the first FEC code and the first FEC code keys associated with them into symbols suitable for use by the second FEC decoder 330 and the converted FEC code keys which describe the relationship between the converted symbols and the source symbols of the second FEC code. There may be a one-to-one correspondence between the encoding symbols of the first FEC code input to the symbol converter and the encoding symbols output by the symbol converter. Alternatively, there may be a one-to-many or many-to-one correspondence between the encoding symbols of the first FEC code input to the symbol converter and the encoding symbols output by the symbol converter. Information from the first FEC code keys input to the symbol converter may be used to determine the correspondence between the encoding symbols of the first FEC code supplied as input to the symbols converter and the encoding symbols output by the symbol converter, the conversion operation performed by the symbol converter and the generation of the converted FEC code keys output by the symbol converter. Information from the first FEC code keys input to the symbol converter may be used to determine the content of all or part of the encoding symbols output by the symbol converter.

We now describe a method of symbol conversion which may be employed by the symbol converter 320 in the case that the second code source symbols which can be derived from a first code source symbol each comprises a specific sequence of (not necessarily contiguous) bits of the first code source symbol, said sequences of bit positions being the same for each first code source symbol. The method comprises the following steps for each first code encoding symbol EF:

(1) the associates, $SF_0, SF_1, SF_{(d-1)}$ of the first code encoding symbol EF are identified, using the first code key (2) for each associate whose value is known, either because the source symbol was received directly or recovered by the first code decoder 310, the value of this associate may eliminated from the encoding symbol EF by means of the protection operation. This reduces the number of associates of the encoding symbol EF.

(3) for each associate, the second code source symbols which can be derived from that associate are identified. We denote the second code source symbols derived from $SF_i$ by $SS_{i,0}, \ldots, SS_{i,n}$. Each second code source symbol comprises a specific sequence of bits taken (not necessarily contiguously) from the first code source symbol $SF_i$. We denote the bit positions at which the bits comprising second code source symbol $SS_{i,j}$ are located as $B_{j0}, B_{j1}, \ldots B_{jM}$. where M is the symbol size of the source symbols of the second code.

(4) output n converted encoding symbol, where the jth converted encoding symbol $ES_j$ comprises bits $B_{j0}, B_{j1}, \ldots, B_{jM}$ of first code encoding symbol EF.

(5) ouput n keys, where the jth key identifies the associates of $ES_j$ as $SS_{0,j}, SS_{1,j}, \ldots, SS_{(d-1),j}$.

In certain embodiments, including a specific embodiment which will be described further below, some of the bits of a second code source symbol may be derived not from a first code source symbol but instead from the first code key or may be set to specific known values. In this case, the value of these bits within the first code source symbols may be known even if the entire source symbol itself is not known. The method above may then be modified such that the specific corresponding bits of the converted encoding symbol may be calculated by applying the protection operation to the known bits of the first code source symbols, even though the remainder of the first code source symbols may not be known.

At the decoder, on receipt of a combination of zero or more source symbols and zero or more repair symbols for a source block, a method of decoding is provided comprising three steps as follows:

(1) if any symbols of the first code have been received, the first code decoder 310 checks whether any source symbols can be recovered from the first code alone, for example by applying the usual procedures for decoding of the first code. If this step recovers all the missing source symbols, then the decoding process is finished.

(2) if source symbols are still missing, the second code decoder 320 checks whether any further source symbols can be recovered from the repair symbols of the second code, for example using the usual procedures for decoding of the second code (including as input any source symbols recovered in step 1). If this step recovers all the missing source symbols, then the process is finished.

(3) if source symbols are still missing, then the remaining repair symbols of the first code are provided to the symbol converter 320 for conversion into encoding symbols that may be used by the second code decoder 330. Two methods of decoding using these additional symbols are described below, labeled Method (3a) and Method (3b). Method (3a) is applicable to a case in which the second code is represented using the generalized matrix description of systematic forward erasure code described above and Method (3b) is applicable in the case in which the second code is represented in the generalized matrix description of certain chain reaction codes, also described above.

Method (3a) comprises two steps as follows:

(3.a1) the generalized matrix for the second code is augmented by the addition of a new row for each converted encoding symbol provided by the symbol converter. The additional matrix row for a given converted encoding symbol is constructed as the matrix row which represents the linear combination of the second code source symbols which is equal to the converted encoding symbol: that is, the new matrix row has the property that the product of the new matrix row and the column vector comprising the source symbols of the second code is equal to the converted encoding symbol in question. As will be clear to those of ordinary skill in the art of linear algebra, this property uniquely characterizes the new matrix row. It should be noted that this matrix row may not be identical to the matrix row for the first code encoding symbol within the matrix description of the first code itself because the source block over which this repair symbol was constructed may be a subset of the source block over which the second code repair symbols have been constructed;

(3a.2) decoding is attempted again, using this augmented matrix.

Method (3b) comprises two steps as follows:

(3b.1) the generalized matrix for the second code is augmented by the addition of a new row for each converted encoding symbol. We first construct a row vector which represents the linear combination of second code encoding symbols which is equal to the converted encoding symbol, that is, a row vector with the property that the product of the row vector with a column vector comprising the second code source symbols is equal to the converted encoding symbol in question. Secondly, we construct the matrix consisting of those rows of the generalized matrix description of the second code which correspond to the source symbols. Thirdly, we calculate the product of the row vector constructed in the first step with the matrix constructed in the second step to obtain a new row vector. The new matrix row for the converted encoding symbol is equal to the new row vector calculated in this third step;

(3b.2) decoding is attempted again, using this augmented matrix.

In an alternative embodiment, a method of decoding is provided comprising only the steps (1) and (3) above.

Efficient Hybrid Codes Using Inactivation Decoding

In a further specific embodiment, the second code is a chain reaction code, represented in the generalized matrix form described above and decoded using the method of "inactivation decoding", such as that described in Shokrollahi II.

Many erasure codes can be efficiently decoded using a form of Gaussian Elimination known as "inactivation decoding". In a standard Gaussian Elimination process, a matrix is considered to have two regions, an unprocessed region and a processed region. At the start of the process the unprocessed region is the whole of the matrix and the processed region is empty. At each stage of the process, a non-zero pivot element, A, is chosen from among the elements of the unprocessed region of the matrix. The row containing the pivot element is known as the pivot row, $P_R$, and the column containing the pivot element is known as the pivot column, $P_C$. From this point, the pivot row is marked as processed. Then, for each row, X, intersecting the unprocessed region of the matrix which has a non-zero, unprocessed element, B, in the pivot column, then the result of multiplying the pivot row by $-BA^{-1}$ is added to row X. This last step is known as a "row operation" and is expressed as a function operation as shown in Equation 1. The pivot column is then marked as processed (i.e., removed from the unprocessed region of the matrix).

$$\text{RowOp}[P_R, X, -BA^{-1}] \qquad \text{(Equ. 1)}$$

The resulting matrix may then be operated on by row and column exchanges such that the pivot elements lie on the diagonal in the order in which they were chosen as pivot elements. This will transform the submatrix into upper triangular form, at which point, as is well known, further row operations can be applied to reduce it to the identity matrix.

Actual decoding is realized by repeating the sequence of row operations (in the same order) on the symbols of the code, i.e., for each row operation (shown in Equation 1), the decoder adds the result of multiplying symbol $P_R$ by $-BA^{-1}$ to symbol X. The result of applying this method will be that the received encoding symbols are transformed into the intermediate symbols, from which the original source symbols can then easily be recovered.

"Inactivation decoding" herein preferably refers to a decoding algorithm equivalent to the above process with the following approach for choosing the pivot element:

(1) if rows exist with only a single non-zero unprocessed element, then this element is chosen as the pivot element.

(2) if no such rows exist, then if a column exists with no non-zero elements within the processed region, and at least one non-zero element in the unprocessed region, then a non-zero element in this column in the unprocessed region is chosen as the pivot element.

(3) if no such columns exist, then any non-zero element in the unprocessed region is chosen as the pivot element.

Note that pivot columns chosen according to rule (3) above are known as "inactivated" columns. The operation of rule (2) means that they will not be chosen as pivot columns until the point at which all the columns remaining in the unprocessed part of the matrix meet the "inactivated" criteria. When this technique is used for decoding chain reaction codes, then addition of a converted encoding symbol to the decoding matrix can be efficiently achieved as follows:

(1) the above decoding process is followed until there are no non-zero elements remaining in the unprocessed region of the matrix.
(2) if the number of columns containing unprocessed elements exceeds the number of converted encoding symbols available, then decoding will not be possible and the process stops.
(3) a new row is added to the matrix for each converted encoding symbol. An element in such a new row, a, in column b, is considered processed if and only if there are no unprocessed elements in the rest of column b. As noted above, each converted encoding symbol is equal to a linear combination of the second code source symbols. The matrix row for the first code symbol is constructed as the same linear combination of the original matrix rows for the source symbols as follows: We first construct a row vector which represents the linear combination of second code encoding symbols which is equal to the converted encoding symbol, that is, a row vector with the property that the product of the row vector with a column vector comprising the second code source symbols is equal to the converted encoding symbol in question. Secondly, we construct the matrix consisting of those rows of the generalized matrix description of the second code which correspond to the source symbols. Thirdly, we calculate the product of the row vector constructed in the first step with the matrix constructed in the second step to obtain a new row vector. The new matrix row for the converted encoding symbol is equal to the new row vector calculated in this third step.
(4) For each processed element, B, in one of the new first repair symbol rows, there is a unique row R among the rows corresponding to chain reaction code symbols (source, repair or static) which has a non-zero element, A, in the same column as B. The result of multiplying row R by $-BA^{-1}$ is then added to the first repair symbol row.
(5) The processed elements of the new first repair symbol rows are now zero and if there are non-zero elements among the unprocessed elements then the Gaussian elimination process can continue with this new augmented matrix.

EXAMPLES OF FIRST FEC CODES

Parity Code

In this case, first FEC code symbols are calculated as the XOR of a number of source symbols. In many cases, each source data packet sent contains a number, G, of consecutive source symbols. Suppose there are K source symbols in total, $S_0$ to $S_{K-1}$ and the largest number of source symbols placed into a single packet is $G_{max}$. Define $G_{max}$ first code repair symbols, $R_i$ for $i=0, \ldots, (G_{max}-1)$ as shown in Equation 2.

$$R_i = \text{sum}\{S_j; 0 <= j < K \text{ and } (j \% G_{max}) = i\} \quad \text{(Equ. 2)}$$

The $G_{max}$ first code repair symbols are placed into a single packet. Receipt of these P first code source symbols allows any consecutive set of P lost repair symbols to be recovered, and thus a single lost source packet can be recovered using the first code repair packet.

Interleaved Parity Code

In this case, first code encoding symbols are calculated as the XOR of a number of source symbols. In many cases, each source data packet sent contains a number, G, of consecutive source symbols. Suppose there are K source symbols in total, $S_0$ to $S_{K-1}$ and the largest number of source symbols placed into a single packet is G. Suppose the interleaving depth required is D. Define $D \cdot G_{max}$ prefix code repair symbols, $R_i$ for $i=0, \ldots, (D \cdot G_{max}-1)$ as shown in Equation 3.

$$R_i = \text{sum}\{S_j; 0 <= j < K \text{ and } (j \% G_{max}) = (i \% G_{max}) \text{ and } \text{floor}(j/G_{max}) \% D = \text{floor}(I/G_{max})\} \quad \text{(Equ. 3)}$$

The $D \cdot G_{max}$ first code repair symbols are placed into D packets, each packet containing $G_{max}$ symbols, such that the first packet contains symbols $0, \ldots, G_{max}-1$, the second packet contains symbols $G_{max}, \ldots, 2 \cdot G_{max}-1$ etc.

Other Well-Known Parity Codes

Many parity codes are known within particular application areas. For example RFC 2733 describes examples of codes. Codes described in the "Professional-MPEG Code of Practice 3" might be used with streams of RTP packets.

As will be clear to those of skill in the art upon review of this disclosure, parity symbols which are equal in value to symbols constructed according to the method above may be extracted from the packets generated by these codes, even if the source block structure used by the second code is not exactly the same as that used by the prefix code. In particular, these codes define for each packet a block of data (referred to herein as "source packet information") and perform XOR operations across the source packet information of multiple packets to obtain a parity symbol. As previously described, this source packet information may or may not be equal to a specific set of source symbols from the perspective of the second FEC code. However, so long as at least some portion of the first code source packet information is equal to a set of source symbols of the second code, and so long as the portions are aligned across the source packet information of different packets, then the resulting parity packets will contain data corresponding to parity symbols constructed as the XOR or source symbols of the second FEC code, and thus the combination technique may be applied.

Thus, in another embodiment, codes such as these may be used as a first code without modification to the code and the packetization structure used by that code.

Reed-Solomon Codes

It is well known that Reed-Solomon codes may be constructed according to the generalized matrix description of systematic erasure codes as presented above. However, it should be understood that implementations according to the present invention are not limited to those that use Reed-Solomon codes.

Codes can be constructed using Cauchy matrices or Vandermonde matrices converted into systematic form. Such codes may therefore be used as first FEC codes within a hybrid code.

In general, Reed-Solomon codes are calculated over finite fields larger than GF(2), for example GF(16) or GF(256). Chain reaction codes that operate only over GF(2) are well known. For example, see those described (Luby II and Luby III). In the case of a hybrid code built from a first FEC code constructed over one field and a second code constructed of a different (smaller or larger) field, it is then necessary to transform the matrix into a matrix over the largest field used at the appropriate point during the Gaussian elimination. This can always be done provided there exists an embedding of the smaller field into the larger one—which is generally the case with the fields employed in such codes. For example there is a trivial embedding of GF(2) into GF(256) in which the zero element of GF(2) is mapped to the zero element of GF(256) and the identify element of GF(2) mapping to the identity element of GF(256). Techniques for handling such matrices built from multiple finite fields in the context of erasure coding are described in the references cited above (Luby III, Shokrollahi I, Shokrollahi II, and possibly others) and may be applied to the case of hybrid codes.

EXAMPLES OF SECOND FEC CODES

The second FEC code used in the hybrid code schemes described here may be any of many forward erasure correction codes which are known in the art. For example, the second FEC codes chain reaction codes such as LT Codes and Raptor Codes or fixed rate codes such as Reed-Solomon codes, Low-Density Parity Check Codes, LDGM Staircase and LDGM Triangle codes.

EXAMPLES OF HYBRID CODES

As will be clear from the above examples of first and second codes, many examples of hybrid codes can be given by choosing any of the first codes and any of the second codes. A specific example would be a simple parity code combined with a chain reaction code such as Raptor codes. Another example would be an interleaved parity code combined with a chain reaction code. A further example would be the Professional-MPEG Code of Practice 3 code combined with a chain reaction code. A further example would be a Reed-Solomon code combined with a chain reaction code. Other examples include: a simple parity code combined with a Reed-Solomon code, a Reed-Solomon code combined with a LDPC or LDGM code, a simple parity code combined with a LDPC or LDGM code. An example of a triple hybrid code is: the first code is a simple parity code, the second code is a Reed-Solomon code, and the third code is an LDPC, LDGM or chain reaction code.

In a specific embodiment of an encoder or decoder wherein FEC protection is provided to an RTP stream, the first FEC code is a code described in the Pro-MPEG Code of Practice 3 [Pro_MPEG] and SMPTE standard 2022-1, which is a simple interleaved parity code, and the second FEC code is a Raptor code, which is a multi-stage chain reaction code.

In this embodiment, the second code is a variation of an FEC streaming system described in Luby II. The source symbols of this code may be smaller than those of the first FEC code. In a system described in Luby II, a source block is constructed, comprising for each source packet:
A flow identifier
A packet length indicator
The UDP Payload of the packet
Padding bytes Data included within the source block corresponding to a single packet is referred to as "Source Packet Information".

In this embodiment, the system protects a single flow of RTP packets. As a result, the flow identifier takes a single fixed value for every packet which is known to encoder and decoder, which may be zero and is assumed to be zero hereinafter. Furthermore, the packet length indicator used in this embodiment is the RTP payload length. As will be clear on review of the referenced specifications, the restrictions implied by the first code require a straightforward relationship between the RTP payload length and UDP payload length.

In the case that a receiver receives FEC repair packets from both the first and second codes, then a hybrid decoding approach may be provided. The following procedures may be followed to achieve this and are included here as a specific embodiment of the generalized hybrid approach described above.

In an example of hybrid decoding, it proceeds in three steps:
Step 1: SMPTE 2022-1 Decoding
In this step, the packets encoded according to SMPTE 2022-1, together with the received source packets, are processed as usual to recover zero of more source packets.
Step 2: Raptor Decoding
In this step, if source packets are still missing, then packets encoded according to Raptor, together with the received source packets and any source packets which were recovered in Step 1, are processed using Raptor decoding procedures.
Step 3: Hybrid Decoding
In this step, if source packets are still missing, then remaining (unprocessed) SMPTE 2022-1 packets are converted to a form in which they can be added to the Raptor decoding process, and Raptor decoding is then continued.

Conversion of SMPTE 2022-1 packets and their use in Raptor decoding are described in the following sections.

As will be clear to those of skill in the are of erasure coding, the three steps above may involve increasingly complex calculations, step (1) being the simplest and step (3) being the most complex. An advantage of the method described above is that the more complex steps are performed only if required based on the set of received packets. Thus the computational complexity of the decoding method is on average much lower than if, for example, the second code were used alone.

In an alternative embodiment, only steps 1 and 3 are performed.

Conversion of SMPTE 2022-1 Packets

The objective of this conversion operation of SMPTE 2022-1 packets is to convert them into a form such that they can be included in the Raptor decoding process. According to SMPTE 2022-1, each FEC packet is constructed by applying a protection operation, based on the exclusive OR operation (XOR), to a number, D, of the source packets (the "protected packets"). The UDP payload of the SMPTE 2022-1 packet contains the following data (amongst other fields):
An FEC header containing:
The Length Recovery field, which is the XOR of the RTP payload lengths of the protected packets
The XOR of the Payload Type (PT) fields of the RTP headers of the protected packets
The XOR of the Timestamp (TS) fields of the RTP headers of the protected packets
The XOR of the RTP payloads of the protected packets In the first step of the conversion operation, the fields of each received or recovered source packet protected by a received SMPTE 2022-1 FEC packet, are XORed into the corresponding fields of the FEC packet. After this operation, the fields of the FEC packet are each equal to the XOR of the corresponding fields of the remaining (unrecovered) protected packets (which we call the "unrecovered protected packets").

In the second step of the conversion operation, for each remaining SMPTE 2022-1 FEC packet, the following fields are concatenated to form a 'virtual' Raptor repair packet payload:

A single zero byte

A two byte length indication, which is equal to the XOR of the RTP payload lengths of the unrecovered protected packets, taken directly from the SMPTE 2022-1 FEC packet A two-bit field, which is equal to the XOR of the RTP Version fields of the unrecovered protected packets. This is equal to zero if the number of unrecovered protected packets is even and 2 otherwise.

Seven (7) zero bits, corresponding to the XOR of the RTP Padding (P), Extension (X), CSRC Count (CC) and Marker (M) bits of the unrecovered protected packets, which are all required to be zero according to SMPTE 2022-1.

A seven (7) bit field equal to the XOR of the RTP Payload Type (PT) fields of the unrecovered protected packets (taken directly from the corresponding field of the SMPTE 2022-1 FEC header).

A 16-bit field equal to the XOR of the RTP Sequence Number fields of the unrecovered protected packets. The Sequence Numbers of the unrecovered protected packets can be explicitly calculated based on the SNbase, offset and NA values of the FEC header of the FEC packet as per SMPTE 2022-1.

A 32-bit field equal to the XOR of the RTP Timestamp (TS) fields of the unrecovered protected packets (taken directly from the corresponding field of the SMPTE 2022-1 FEC header).

A 32-bit field equal to the XOR of the RTP SSRC fields of the unrecovered protected packets. This is equal to zero if the number of unrecovered protected packets is even and equal to the SSRC of the stream otherwise.

The XOR of the RTP payloads of the unrecovered protected packets, taken directly from the remainder of the SMPTE 2022-1 FEC packet A number of zero-valued padding bytes, such that the total length of the "virtual" repair packet payload is equal to the length of the other Raptor repair packet payloads (which are required to all be the same according to SectionE.4.3.2.5).

The resulting "virtual" repair packet payload is then equal to the XOR of the Source Packet Information of the unrecovered protected packets.

Extension of Raptor Decoding

A possible Raptor decoding algorithm is described in Luby II in terms of a Gaussian Elimination process upon a matrix A. As will be clear to those of skill in the art of linear algebra, this method is equivalent to the method of "inactivation decoding" described herein. If decoding is not possible without use of the SMPTE 2022-1 packets, then this decoding process will fail during the "second phase" described in Luby II. At this point, the matrix A has less than L non-zero rows (Note, the symbol L here denotes the number of intermediate symbols of the Raptor code, not the L value associated with the SMPTE 2022-1 packets).

Let G be the number of symbols per packet (which can be calculated as the Raptor repair packet payload size divided by the symbol size). Then each "virtual" Raptor repair packet constructed above, in this example, consists of exactly G new symbols, each of which is the XOR of exactly $N_S$ source symbols (which we call the "unrecovered protected symbols"), where $N_S$ is the number of unrecovered protected packets associated with the SMPTE 2022-1 FEC packet from which the "virtual" Raptor repair packet was constructed.

For each such new symbol, a new row is added to the decoding matrix A. This row is constructed as follows:

The row is initialized to zero

For each of the $N_S$ unrecovered protected symbols, the LTEnc generator is used to determine the set of intermediate symbols whose sum is equal to the unrecovered protected symbol. For each such intermediate symbol a '1' is XORed into the appropriate position of the new row Phase two of the decoding process is then continued with these additional rows and symbols.

Advantages of Hybrid Coding:

In general, a hybrid coding system encodes according to two (or more) codes, wherein at least one code is more complex than the other(s). Where two codes are used (the extensions to more than two should be apparent from reading this disclosure), the source data is encoded according to a simple code and according to a complex code. The transmission is of the source data, FEC repair packets of the first simple code and FEC repair packets of the second complex code (assuming systematic coding; nonsystematic coding might be used as well). A decoder can use one or both sets of FEC repair packets independently, and under some conditions, the recovery using both sets together is greater than what is possible using either one alone.

Advantages of this approach have been described above, including:

a variety of receiver types may be deployed, making use of any subset of the provided codes within the hybrid code (for example, either, neither or both of the codes in the case of a hybrid of two codes). This is advantageous because receivers can be adapted to particular conditions and in particular lower complexity, and hence lower cost, receiver can be provided for less challenging environments whilst higher complexity and hence higher cost receivers can be provided for more challenging environments. This is a particular advantage in scenarios where a single transmission will be received by many receivers experiencing different conditions in terms of packet loss and where the conditions in terms of packet loss are relatively static for each receiver. An example would be IPTV deployments of DSL networks. This is also an advantage in the case of network upgrades, where lower complexity receivers may be deployed first and higher complexity receiver introduced later avoiding the "flag day" problem described in detail above.

the set of encoding symbols received and processed by a receiver may be adapted to the conditions in terms of packet loss experienced by that receiver, either through static configuration or dynamically under the control of the receiver or another entity. This is an advantage because resource usage at the receiver for FEC may be reduced to the minimum necessary according to the conditions for that receiver thereby saving resources in comparison to alternative approaches which might require receipt and processing of all the FEC code symbols irrespective of the conditions.

the set of encoding symbols actually used in a decoding operation may be adapted to the requirements of that particular decoding operation, for example by choosing to use only the symbols of the lower complexity code in the case that these symbols alone are sufficient to complete the decoding operation.

A particular advantage of the hybrid approach described herein is that the advantages above may be combined with overall error correction performance which is equivalent to or better than either code applied alone.

Figure 5:
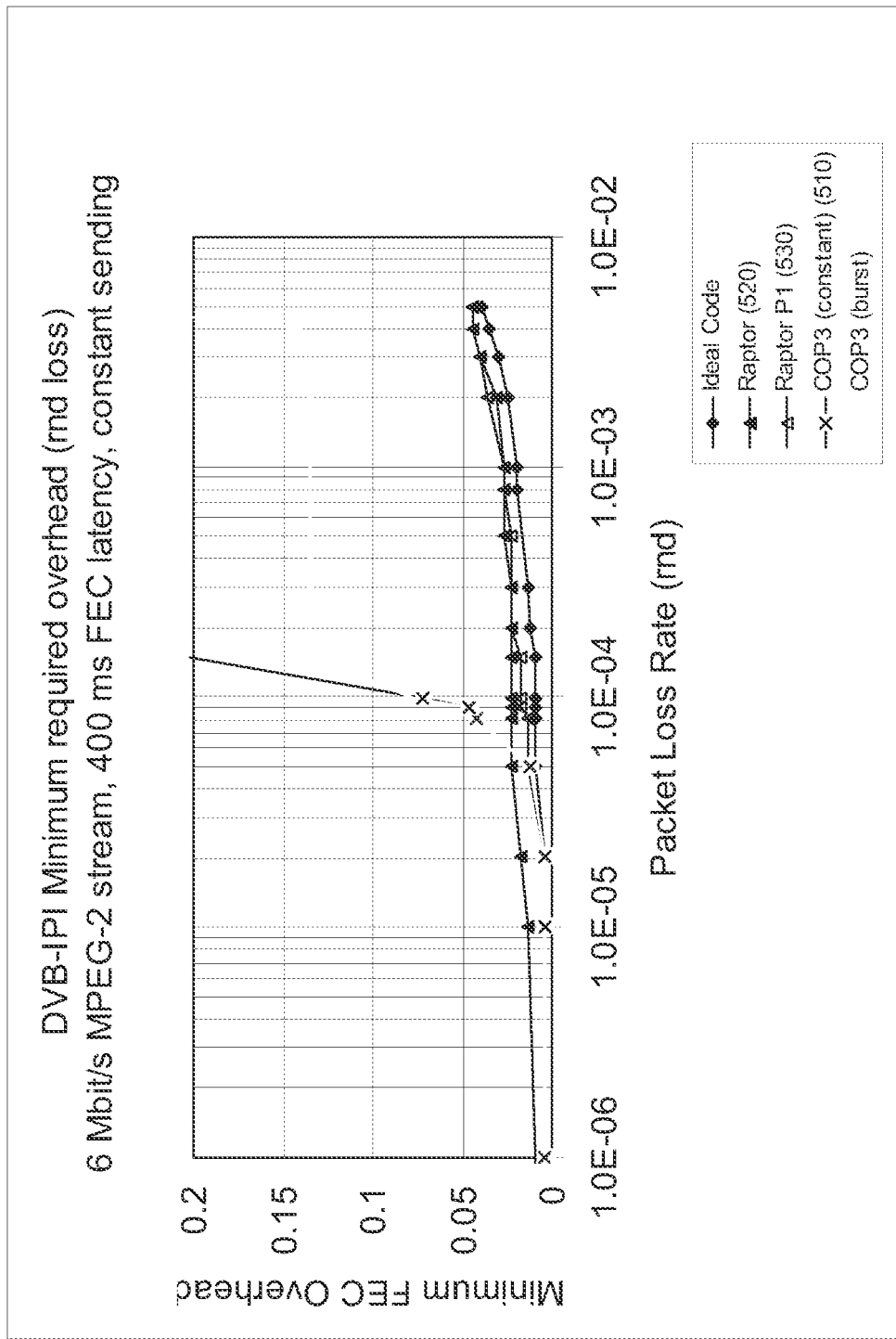
FIG. 5 provides some example performance results for the hybrid coding processes.

FIG. 5 provides error correction performance results for several codes, including the Pro-MPEG Code Of Practice 3 code (510), the Raptor code (520) and a hybrid code (530) in which the codes 510 and 520 are used as first and second code respectively. The figure shows results for a scenario typical for IPTV in which a 6 Mbit/s video stream is encapsulated into IP data packets and sent over a network with FEC protection provided using source blocks each containing 400 ms of video data. The simulated packet loss rate is plotted on the x-axis and for each packet loss rate and each code the amount of FEC overhead required to meet a typical IPTV quality target of an average of one packet loss every four hours is shown.

For example, the point labeled 510 indicates that the Pro-MPEG Code of Practice 3 code required an FEC overhead of just over 4% in order to achieve the quality target at a packet loss rate of $8 \times 10^{-5}$.

The hybrid code shown in this figure was constructed by sending one repair packet for each block constructed using the first (Pro-MPEG) packet and additional repair packets (if required) using the second (Raptor) code. The figure shows that the overhead required by the hybrid code 530 is in all cases less than or equal to the overhead required by either the first code (510) or second code (520) alone.

Note that the plot for the hybrid code 530 is coincident with that for the first code 510 for packet loss rates less than or equal to $2 \times 10^{-5}$. This illustrates that at those low loss rates the first code alone is sufficient.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of decoding information received over a communications channel from an encoder, the method comprising:
   receiving symbols from the communications channel, the received symbols including received source symbols of encoded data, first code encoding symbols generated from the source symbols according to a first FEC code, second code encoding symbols generated from the source symbols according to a second FEC code, first FEC code keys, and second FEC code keys, the first FEC code different from the second FEC code;
   using the received source symbols, the first code encoding symbols, and the first FEC code keys to first recover one or more missing source symbols; and
   if source symbols are still missing following the first recovery,
      converting the first code encoding symbols and the first FEC code keys into converted encoding symbols and converted FEC code keys suitable for use for decoding using the second FEC code, and
      using the received source symbols, the recovered source symbols, the second code encoding symbols, the converted encoding symbols, the second FEC code keys, and the converted FEC code keys to further recover one or more missing source symbols.

2. The method of claim 1, further comprising, following the first recovery and preceding the further recovery, using the received source symbols, the recovered source symbols, the second code encoding symbols, and the second FEC code keys to second recover one or more missing source symbols.

3. The method of claim 1, wherein the second FEC code is represented using a generalized matrix, and the further recovery comprises augmenting the generalized matrix with a new row for each converted encoding symbol.

4. The method of claim 1, wherein converting comprises:
   for at least one first code encoding symbol, identifying source symbols of the first FEC code that are associated with the first code encoding symbol using a corresponding first FEC code key;
   for each identified source symbol of the first FEC code whose value is known, eliminating the value of the identified source symbol from the first code encoding symbol;
   for each identified source symbol of the first FEC code, identifying source symbols of the second FEC code that can be derived from the identified source symbol of the first FEC code, each identified source symbol of the second FEC code comprising a specific first sequence of bits taken from the identified source symbol of the first FEC code, the bits of the specific first sequence located at specific bit positions of the identified source symbol of the first FEC code;
   outputting converted encoding symbols, each converted encoding symbol comprising a specific second sequence of bits taken from the first code encoding symbol, the bits of the specific second sequence located at the same specific bit positions of the first code encoding symbol; and
   outputting converted FEC code keys, each converted FEC code key identifying source symbols of the second FEC code that are associated with a corresponding converted encoding symbol.

5. A hybrid decoder for decoding information received over a communications channel from an encoder, the hybrid decoder comprising:
   an input for receiving symbols from the communications channel, the received symbols including received source symbols of encoded data, first code encoding symbols generated from the source symbols according to a first FEC code, second code encoding symbols generated from the source symbols according to a second FEC code, first FEC code keys, and second FEC code keys, the first FEC code different from the second FEC code;
   a first FEC code decoder communicatively coupled with the input and configured to use the received source symbols, the first code encoding symbols, and the first FEC code keys to recover one or more missing source symbols;
   a symbol converter communicatively coupled with the first FEC code decoder and configured to convert the first code encoding symbols and the first FEC code keys into converted encoding symbols and converted FEC code keys suitable for use by a second FEC code decoder; and
   the second FEC code decoder communicatively coupled with the symbol converter and configured to use the received source symbols, the recovered source symbols, the second code encoding symbols, the converted encoding symbols, the second FEC code keys, and the converted FEC code keys to recover one or more missing source symbols.

6. The hybrid decoder of claim 5, wherein the second FEC code decoder is further configured to recover one or more missing source symbols using the received source symbols, the recovered source symbols, the second code encoding symbols, and the second FEC code keys without using the converted encoding symbols or the converted FEC code keys.

7. The hybrid decoder of claim 5, wherein the second FEC code decoder is configured to represent the second FEC code using a generalized matrix and to augment the generalized matrix with a new row for each converted encoding symbol.

8. The hybrid decoder of claim 5, wherein the symbol converter is configured to:
- identify, for at least one first code encoding symbol, source symbols of the first FEC code that are associated with the first code encoding symbol using a corresponding first FEC code key;
- eliminate, for each identified source symbol of the first FEC code whose value is known, the value of the identified source symbol from the first code encoding symbol;
- identify, for each identified source symbol of the first FEC code, source symbols of the second FEC code that can be derived from the identified source symbol of the first FEC code, each identified source symbol of the second FEC code comprising a specific first sequence of bits taken from the identified source symbol of the first FEC code, the bits of the specific first sequence located at specific bit positions of the identified source symbol of the first FEC code;
- output converted encoding symbols, each converted encoding symbol comprising a specific second sequence of bits taken from the first code encoding symbol, the bits of the specific second sequence located at the same specific bit positions of the first code encoding symbol; and
- output converted FEC code keys, each converted FEC code key identifying source symbols of the second FEC code that are associated with a corresponding converted encoding symbol.

9. A system for decoding transmitted data that encodes for a set of source symbols transmitted over a communications channel, the system comprising:
- means for receiving symbols from the communications channel, the received symbols including received source symbols of the encoded data, first code encoding symbols generated from the source symbols according to a first FEC code, second code encoding symbols generated from the source symbols according to a second FEC code, first FEC code keys, and second FEC code keys, the first FEC code different from the second FEC code;
- means for recovering one or more missing source symbols using the received source symbols, the first code encoding symbols, and the first FEC code keys; and
- if source symbols are still missing following the first recovery,
  - means for converting the first code encoding symbols and the first FEC code keys into converted encoding symbols and converted FEC code keys suitable for use by means for recovering missing source symbols using the second FEC code, and
  - means for further recovering one or more missing source symbols using the received source symbols, the recovered source symbols, the second code encoding symbols, the converted encoding symbols, the second FEC code keys, and the converted FEC code keys.

10. The system of claim 9, wherein the means for further recovering further comprise means for recovering one or more missing source symbols using the received source symbols, the recovered source symbols, the second code encoding symbols, and the second FEC code keys without using the converted encoding symbols or the converted FEC code keys.

11. The system of claim 9, wherein the second FEC code is represented using a generalized matrix, which is augmented with a new row for each converted encoding symbol.

12. The system of claim 9, wherein the means for converting are configured to:
- identify, for at least one first code encoding symbol, source symbols of the first FEC code that are associated with the first code encoding symbol using a corresponding first FEC code key;
- eliminate, for each identified source symbol of the first FEC code whose value is known, the value of the identified source symbol from the first code encoding symbol;
- identify, for each identified source symbol of the first FEC code, source symbols of the second FEC code that can be derived from the identified source symbol of the first FEC code, each identified source symbol of the second FEC code comprising a specific first sequence of bits taken from the identified source symbol of the first FEC code, the bits of the specific first sequence located at specific bit positions of the identified source symbol of the first FEC code;
- output converted encoding symbols, each converted encoding symbol comprising a specific second sequence of bits taken from the first code encoding symbol, the bits of the specific second sequence located at the same specific bit positions of the first code encoding symbol; and
- output converted FEC code keys, each converted FEC code key identifying source symbols of the second FEC code that are associated with a corresponding converted encoding symbol.

13. A computer program product for decoding transmitted data that encodes for a set of source symbols transmitted over a communications channel, the computer program product comprising:
- a processor-readable medium storing processor-readable instructions configured to cause a processor to:
  - obtain symbols received from the communications channel, the received symbols including received source symbols of encoded data, first code encoding symbols generated from the source symbols according to a first FEC code, second code encoding symbols generated from the source symbols according to a second FEC code, first FEC code keys, and second FEC code keys, the first FEC code different from the second FEC code;
  - use the received source symbols, the first code encoding symbols, and the first FEC code keys to first recover one or more missing source symbols; and
  - if source symbols are still missing following the first recovery,
    - convert the first code encoding symbols and the first FEC code keys into converted encoding symbols and converted FEC code keys suitable for use for decoding using the second FEC code, and
    - use the received source symbols, the recovered source symbols, the second code encoding symbols, the converted encoding symbols, the second FEC code keys, and the converted FEC code keys to further recover one or more missing source symbols.

14. The computer program product of claim 13, wherein the processor-readable medium is further configured to cause the processor to, following the first recovery and preceding the further recovery, use the received source symbols, the recovered source symbols, the second code encoding symbols, and the second FEC code keys to second recover one or more missing source symbols.

15. The computer program product of claim 13, wherein the processor-readable medium is configured to cause the processor to represent the second FEC code using a generalized matrix and to augment the generalized matrix with a new row for each converted encoding symbol.

16. The computer program product of claim 13, wherein the processor-readable medium is configured to cause the processor to:
- identify, for at least one first code encoding symbol, source symbols of the first FEC code that are associated with the first code encoding symbol using a corresponding first FEC code key;
- eliminate, for each identified source symbol of the first FEC code whose value is known, the value of the identified source symbol from the first code encoding symbol;
- identify, for each identified source symbol of the first FEC code, source symbols of the second FEC code that can be derived from the identified source symbol of the first FEC code, each identified source symbol of the second FEC code comprising a specific first sequence of bits taken from the identified source symbol of the first FEC code, the bits of the specific first sequence located at specific bit positions of the identified source symbol of the first FEC code;
- provide converted encoding symbols, each converted encoding symbol comprising a specific second sequence of bits taken from the first code encoding symbol, the bits of the specific second sequence located at the same specific bit positions of the first code encoding symbol; and
- provide converted FEC code keys, each converted FEC code key identifying source symbols of the second FEC code that are associated with a corresponding converted encoding symbol.

* * * * *